US012627270B2

(12) United States Patent　　　　(10) Patent No.:　US 12,627,270 B2
Moon et al.　　　　　　　　　　　(45) Date of Patent:　May 12, 2026

(54) ELECTRONIC DEVICE INCLUDING FRONT END MODULES FOR WIRELESS ENVIRONMENT

(71) Applicant: Samsung Electronics Co., Ltd., Suwon-si (KR)

(72) Inventors: Yohan Moon, Suwon-si (KR); Hyunsang Kang, Suwon-si (KR); Hyoseok Na, Suwon-si (KR); Dongil Yang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 142 days.

(21) Appl. No.: 18/597,331

(22) Filed: Mar. 6, 2024

(65) Prior Publication Data

US 2024/0322770 A1　　Sep. 26, 2024

Related U.S. Application Data

(63) Continuation of application No. PCT/KR2024/001965, filed on Feb. 8, 2024.

(30) Foreign Application Priority Data

Mar. 23, 2023　　(KR) ........................ 10-2023-0038175

(51) Int. Cl.
　*H03F 3/24*　　　(2006.01)
　*H04B 1/04*　　　(2006.01)
(52) U.S. Cl.
　CPC .............. *H03F 3/245* (2013.01); *H04B 1/04* (2013.01); *H03F 2200/451* (2013.01); *H04B 2001/045* (2013.01)
(58) Field of Classification Search
　CPC ... H04J 14/06; H04B 10/616; H04B 10/6166; H04B 10/2513; H04B 10/6971;
(Continued)

(56) References Cited

U.S. PATENT DOCUMENTS 7,486,134 B2　　2/2009　Chang et al.
7,629,783 B2　　12/2009　Chang
(Continued)

FOREIGN PATENT DOCUMENTS

CN　　216721327　U　　6/2022
JP　　4634432　B2　　11/2010
(Continued)

OTHER PUBLICATIONS

Search Report and Written Opinion dated May 28, 2024 issued in International Patent Application No. PCT/KR2024/001965.

*Primary Examiner* — Aristocratis Fotakis
(74) *Attorney, Agent, or Firm* — Nixon & Vanderhye, P.C.

(57)　　　　ABSTRACT

An electronic device is provided. The electronic device includes: a first antenna, a second antenna, and a third antenna, a first power supply circuit, a second power supply circuit, a first front end module (FEM) including a power amplifier (PA) connected to the first antenna and configured to operate based on a voltage from the first power supply circuit, a second FEM including a PA connected to the second antenna and configured to operate based on a voltage from the second power supply circuit, a third FEM including a PA connected to the third antenna and configured to operate based on the voltage from the first power supply circuit and the voltage from the second power supply circuit and obtain a transmit (Tx) power in a range higher than a range of Tx power obtained using each of the PA in the first FEM and the PA in the second FEM, and at least one processor.

17 Claims, 12 Drawing Sheets

(58) Field of Classification Search
CPC ......... H04L 25/03159; H04L 25/03885; H04L 25/03834; H04L 2025/03636; H03F 2200/451
See application file for complete search history.

(56) References Cited

U.S. PATENT DOCUMENTS

| | | | |
|---|---|---|---|
| 8,041,315 B2 | 10/2011 | Haemaelaeinen et al. | |
| 10,291,181 B2 | 5/2019 | Kim et al. | |
| 11,336,242 B2 | 5/2022 | Kim et al. | |
| 2004/0061380 A1 | 4/2004 | Hann et al. | |
| 2016/0173031 A1* | 6/2016 | Langer | H03F 3/189 |
| | | | 330/126 |
| 2018/0287563 A1 | 10/2018 | Henzler et al. | |
| 2021/0083635 A1* | 3/2021 | Kim | H03F 3/68 |
| 2022/0123744 A1* | 4/2022 | Khlat | H03K 17/302 |
| 2022/0166309 A1 | 5/2022 | Maruyama et al. | |
| 2022/0201512 A1* | 6/2022 | Yu | H04B 1/50 |
| 2023/0031065 A1 | 2/2023 | Manolakos et al. | |
| 2023/0188104 A1 | 6/2023 | Xu et al. | |
| 2023/0198563 A1* | 6/2023 | Kim | H04B 1/0483 |
| | | | 455/101 |
| 2024/0014847 A1* | 1/2024 | Berhane | H04B 1/44 |
| 2024/0146351 A1* | 5/2024 | Cai | H02H 7/20 |

FOREIGN PATENT DOCUMENTS

| | | |
|---|---|---|
| JP | 2022084256 A | 6/2022 |
| KR | 20050071512 A | 7/2005 |
| KR | 100840399 B1 | 6/2008 |
| KR | 101354222 B1 | 1/2014 |
| KR | 10-2018-0048076 | 5/2018 |
| KR | 10-2021-0033344 A | 3/2021 |
| KR | 10-2022-0025516 | 3/2022 |
| KR | 10-2022-0105634 | 7/2022 |
| KR | 10-2022-0138966 A | 10/2022 |

* cited by examiner

ELECTRONIC DEVICE INCLUDING FRONT END MODULES FOR WIRELESS ENVIRONMENT

CROSS-REFERENCE TO RELATED APPLICATIONS

This application is a continuation of International Application No. PCT/KR2024/001965 designating the United States, filed on Feb. 8, 2024, in the Korean Intellectual Property Receiving Office and claiming priority to Korean Patent Application No. 10-2023-0038175, filed on Mar. 23, 2023, in the Korean Intellectual Property Office, the disclosures of each of which are incorporated by reference herein in their entireties.

BACKGROUND

Field

The disclosure relates to an electronic device including front end modules (FEMs) for a wireless environment.

Description of Related Art

An electronic device may include front end modules (FEMs) to transmit or receive a signal on each of various frequencies. For example, the FEMs may include a PA (power amplifier) for a transmit (Tx) power of a signal to be transmitted from the electronic device via antennas connected to the FEMs.

The above-described information may be provided as a related art for the purpose of helping to understand the present disclosure. No claim or determination is raised as to whether any of the above-described information may be applied as a prior art related to the present disclosure.

SUMMARY

An electronic device is provided. The electronic device may comprise: a first antenna, a second antenna, and a third antenna. The electronic device may comprise a first power supply circuit. The electronic device may comprise a second power supply circuit. The electronic device may comprise a first front end module (FEM) including a power amplifier (PA) connected to the first antenna and configured to operate based on a voltage from the first power supply circuit. The electronic device may comprise a second FEM including a PA connected to the second antenna and configured to operate based on a voltage from the second power supply circuit. The electronic device may comprise a third FEM including a PA connected to the third antenna and configured to operate based on the voltage from the first power supply circuit and the voltage from the second power supply circuit and obtain a transmit (Tx) power in a range higher than a range of Tx power obtained using each of the PA in the first FEM and the PA in the second FEM. The electronic device may comprise at least one switch. The electronic device may comprise at least one processor comprising processing circuitry. At least one processor is configured to transmit, via the third antenna, a signal with a Tx power obtained using the PA in the third FEM operating based on the voltage from the first power supply circuit and the voltage from the second power supply circuit. At least one processor is configured to, while the signal is transmitted via the third antenna, through the at least one switch, electrically disconnect the PA in the first FEM from the first power supply circuit and electrically disconnect the PA in the second FEM from the second power supply circuit.

An electronic device is provided. The electronic device may comprise: a first antenna, a second antenna, and a third antenna. The electronic device may comprise a first power supply circuit. The electronic device may comprise a second power supply circuit. The electronic device may comprise a first front end module (FEM) connected to the first antenna including a power amplifier (PA) configured to operate based on a voltage provided from the first power supply circuit. The electronic device may comprise a second FEM connected to the second antenna including a PA configured to operate based on a voltage provided from the second power supply circuit. The electronic device may comprise a third FEM connected to the third antenna including a PA configured to operate based on a voltage provided from the first power supply circuit and a voltage provided from the second power supply circuit and obtain a transmit (Tx) power in a range higher than a range of a Tx power obtained using each of the PA in the first FEM and the PA in the second FEM. The electronic device may comprise at least one processor comprising processing circuitry. At least one processor is configured to transmit, via the third antenna, a signal with a Tx power obtained using the PA in the third FEM operating based on a voltage provided from the first power supply circuit and a voltage provided from the second power supply circuit. At least one processor is configured to: adjust, to a voltage lower than the voltage provided in accordance with the transmission of the signal from the first power supply circuit to the PA in the third FEM, a voltage provided in accordance with the transmission of the signal from the first power supply circuit to the PA in the first FEM and adjust, to a voltage lower than the voltage provided in accordance with the transmission of the signal from the second power supply circuit to the PA in the third FEM, a voltage provided in accordance with the transmission of the signal from the second power supply circuit to the PA in the second FEM.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
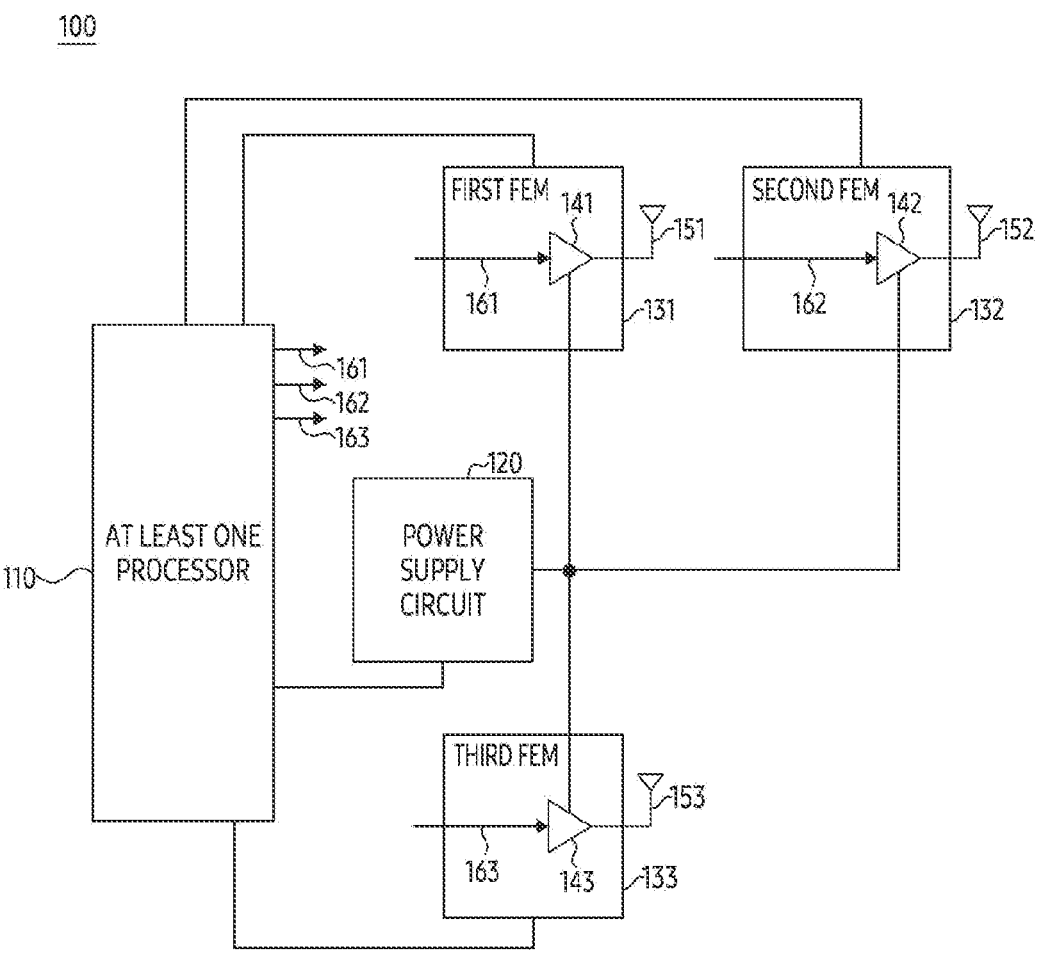
FIG. 1 illustrates an electronic device that includes front end modules (FEMs) respectively including a plurality of PA (power amplifier) connected to a single power supply circuit.

FIG. 1 illustrates an electronic device that includes front end modules (FEMs) respectively including a plurality of PA (power amplifier) connected to a single power supply circuit.

Referring to FIG. 1, an electronic device 100 may include a plurality of antennas including a first antenna 151, a second antenna 152, and/or a third antenna 153, at least one processor (e.g., including processing circuitry) 110, a power supply circuit 120, and a plurality of FEMs including a first FEM 131, a second FEM 132, and/or a third FEM 133. For example, the first FEM 131, the second FEM 132, and/or the third FEM 133 may be connected to the power supply circuit 120, which is a single power supply circuit, for a mounting space of the electronic device 100. For example, a voltage provided to a PA 143 from the power supply circuit 120 may be provided to a PA 141 and a PA 142.

For example, at least one processor 110 may control at least part of operations of each of the power supply circuit 120, the first FEM 131, the second FEM 132, and the third FEM 133.

For example, at least one processor 110 may include various processing circuitry. For example, as used herein, including the claims, the term "processor" may include various processing circuitry, including at least one processor, wherein one or more of at least one processor may be configured to perform various functions described herein. Additionally, the at least one processor may include a combination of processors performing various of the recited/ disclosed functions. At least one processor may execute program instructions to achieve or perform various functions. At least one processor 110 may obtain or generate a signal 161 to be transmitted through the first antenna 151 using the first FEM 131. For example, at least one processor 110 may control the power supply circuit 120 to provide the PA 141 with a voltage (e.g., a collector supply voltage (Vcc)) for a dynamic range of the PA 141. For example, at least one processor 110 may provide the signal 161 to the first FEM 131. For example, the signal 161 may be transmitted through the first antenna 151 with a transmit (Tx) power obtained using the PA 141 operating based on the voltage. The Tx power may be identified by at least one processor 110.

For example, at least one processor 110 may obtain a signal 162 to be transmitted through the second antenna 152 using the second FEM 132. For example, at least one processor 110 may control the power supply circuit 120 to provide the PA 142 with a voltage for a dynamic range of the PA 142. For example, at least one processor 110 may provide the signal 162 to the second FEM 132. For example, the signal 162 may be transmitted through the second antenna 152 with a Tx power obtained using the PA 142 operating based on the voltage. The Tx power may be identified by at least one processor 110.

For example, at least one processor 110 may obtain a signal 163 to be transmitted through the third antenna 153 using the third FEM 133. For example, at least one processor 110 may control the power supply circuit 120 to provide the PA 143 with a voltage for a dynamic range of the PA 143. For example, at least one processor 110 may provide the signal 163 to the third FEM 133. For example, the signal 163 may be transmitted through the third antenna 153 with a Tx power obtained using the PA 143 operating based on the voltage. The Tx power may be identified by at least one processor 110.

For example, a range of the Tx power obtained using the PA 143 may be higher than a range of the Tx power obtained using the PA 141 and a range of the Tx power obtained using the PA 142. For example, since the signal 163 is transmitted to a satellite unlike the signal 161 and the signal 162, which are transmitted to a base station and/or a user equipment, the range of the Tx power obtained using the PA 143 may be higher than the range of the Tx power obtained using the PA 141 and the range of the Tx power obtained using the PA 142. For example, since the signal 163 is transmitted for a coverage wider than respective coverages of the signal 161 and the signal 162, the range of the Tx power obtained using PA 143 may be higher than the range of the Tx power obtained using the PA 141 and the range of the Tx power obtained using the PA 142. For example, since the signal 163 is transmitted for coverage expansion, the range of the Tx power obtained using the PA 143 may be higher than the range of the Tx power obtained using the PA 141 and the range of the Tx power obtained using the PA 142.

As a non-limiting example, since the range of the Tx power obtained using the PA 143 is higher than the range of the Tx power obtained using the PA 141 and the range of the Tx power obtained using the PA 142, a voltage for a dynamic range of the PA 143 may be higher than a voltage for respective dynamic range of the PA 141 and the PA 142. As a non-limiting example, a maximum voltage that each of the PA 141 and the PA 142 may obtain for respective Tx power of the signal 161 and the signal 162 may be lower than a maximum voltage that the PA 143 may obtain for Tx power of the signal 163. For example, absolute maximum rating (AMR) of each of the PA 141 and the PA 142 may be lower than AMR of the PA 143.

For example, since the maximum operating voltage of the PA 143 is higher than the maximum voltage that may be obtained by each of the PA 141 and the PA 142, each of the PA 141 and the PA 142 in a disabling state may be damaged when the voltage provided to the PA 143 from the power supply circuit 120 is obtained for transmitting the signal 163 through the third antenna 153. For example, the disabling states of each of the PA 141 and the PA 142 may include off state of each of the PA 141 and the PA 142. For example, disabling states of each of the PA 141 and the PA 142 may include a state in which the signal 161 and the signal 162 are not transmitted using each of the PA 141 and the PA 142. As a non-limiting example, the damage may be caused by a change in a voltage provided by the power supply circuit 120. The change in the voltage may be illustrated within description of FIGS. 2 and 3.

Figure 2:
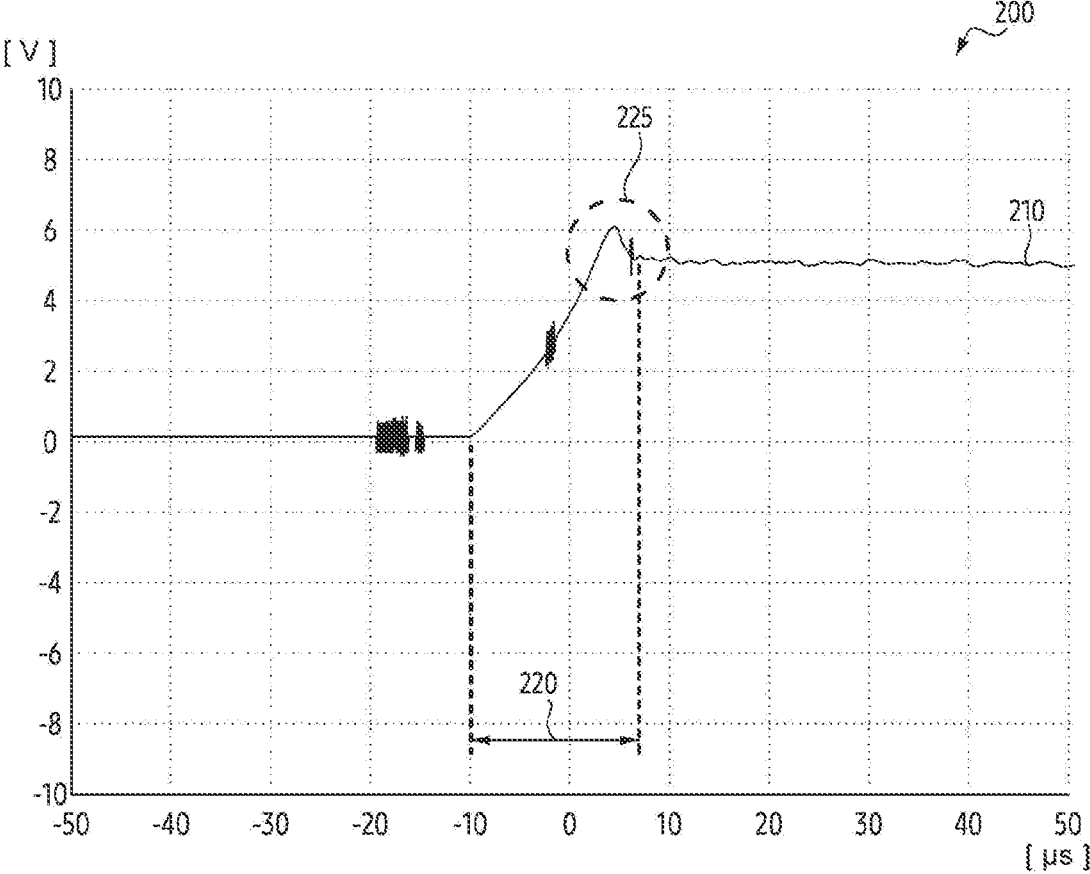
FIGS. 2 and 3 are charts illustrating a change in a voltage provided from a power supply circuit.
Figure 3:
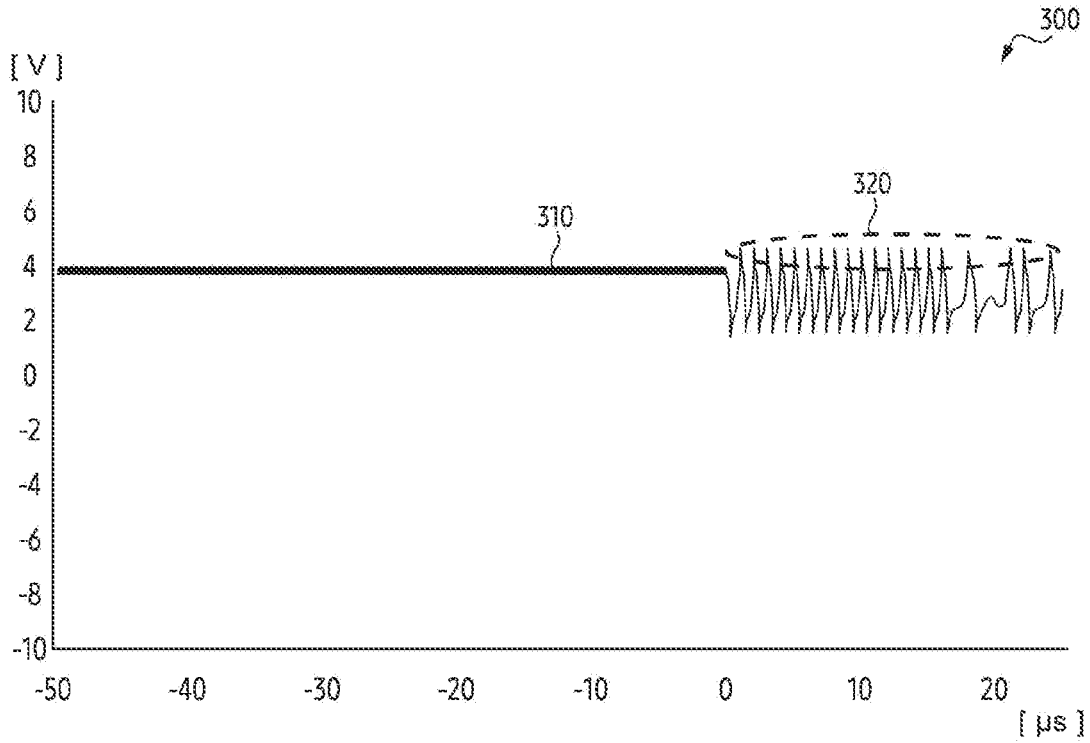

FIGS. 2 and 3 are charts illustrating a change in a voltage provided from a power supply circuit.

Referring to FIG. 2, a chart 200 illustrates a change in a voltage output from a power supply circuit 120. A horizontal axis of the chart 200 indicates time, and unit of the horizontal axis is a microsecond (μs). A vertical axis of the chart 200 indicates a voltage output (or provided) from the power supply circuit 120, and unit of the vertical axis is a volt (V).

For example, when transmitting a signal 163 through a third antenna 153 using a PA 143, the power supply circuit 120 may provide a voltage for a dynamic range of the PA 143, based on control of the at least one processor 110. As a non-limiting example, the voltage provided to the PA 143 may be provided to the PA 143 through a rapid change from 0 (V) to about 5.5 (V), as indicated by a line 210 in time interval 220. As a non-limiting example, overshoot may occur, such as a part 225 of the line 210, due to the rapid change. For example, a peak voltage of the overshoot caused when the voltage is provided from the power supply circuit 120 to the PA 143 may be adjacent to the maximum voltage of each of the PA 141 and the PA 142, each of the PA 141 and the PA 142 may be damaged by the overshoot.

Referring to FIG. 3, a chart 300 illustrates a change in a voltage output from a power supply circuit 120. A horizontal axis of the chart 300 indicates time, and unit of the horizontal axis is a microsecond (μs). A vertical axis of the chart 300 indicates a voltage output (or provided) from the power supply circuit 120, and unit of the vertical axis is a bolt (V).

For example, when the PA 143 obtains a Tx power of the signal 163 to be transmitted through the third antenna 153, a voltage drop may occur in the PA 143. For example, while providing voltage to the PA 143, the power supply circuit 120 may output a relatively high voltage to compensate for the voltage drop. The outputted voltage may cause voltage spikes, such as a part 320 of a line 310. For example, each of the PA 141 and the PA 142 may be damaged by the voltage spikes.

An electronic device illustrated below may include at least one component to reduce (intactly) being provided a voltage, which is provided to the first PA from one or more power supply circuits to transmit a signal using the first PA (e.g., the PA 143), to one or more second PAS (e.g., the PA 141 and the PA 142) connected to the one or more power supply circuits.

For example, the electronic device may include a first antenna, a second antenna, and/or a third antenna. For example, the electronic device may include a first power supply circuit (e.g., the one or more power supply circuits). For example, the electronic device may include a second power supply circuit (e.g., the one or more power supply circuits). For example, the electronic device may include a first FEM including a PA (e.g., the one or more second PAs) that is connected to the first antenna and is configured to operate based on a voltage provided by the first power supply circuit. The electronic device may include a second FEM including a PA (e.g., the one or more second PAs) that is connected to the second antenna and is configured to operate based on a voltage provided by the second power supply circuit. The electronic device may include a third FEM including a PA (e.g., the first PA) that is connected to the third antenna and is configured to operate based on the voltage provided from the first power supply circuit and the voltage provided from the second power supply circuit and obtain a Tx power in a range higher than a range of Tx power obtained using each of the PA in the first FEM and the PA in the second FEM. The electronic device may include at least one processor comprising processing circuitry. The At least one processor may be configured to transmit, via the third antenna, a signal with a Tx power obtained using the PA in the third FEM operating based on the voltage provided from the first power supply circuit and the voltage provided from the second power supply circuit. At least one processor may be configured to: adjust, to a voltage lower than the voltage provided in accordance with the transmission of the signal from the first power supply circuit to the PA in the third FEM, a voltage provided in accordance with the transmission of the signal from the first power supply circuit to the PA in the first FEM and adjust, to a voltage lower than the voltage provided in accordance with the transmission of the signal from the second power supply circuit to the PA in the third FEM, a voltage provided in accordance with the transmission of the signal from the second power supply circuit to the PA in the second FEM. For example, the at least one component may be used for the adjustment.

For example, the electronic device may include: a first antenna, a second antenna, and a third antenna. The electronic device may include a first power supply circuit (e.g., the one or more power supply circuits). The electronic device may include a second power supply circuit (e.g., the one or more power supply circuits). The electronic device may include a first front end module (FEM) including a power amplifier (PA) (e.g., the one or more second PAs) that is connected to the first antenna and is configured to operate based on a voltage from by the first power supply circuit. The electronic device may include a second FEM including a PA (e.g., the one or more second PAs) that is connected to the second antenna and is configured to operate based on a voltage from by the second power supply circuit. The electronic device may include a third FEM including a PA (e.g., the first PA) that is connected to the third antenna and is configured to operate based on the voltage from the first power supply circuit and the voltage from the second power supply circuit and obtain a Tx power in a range higher than a range of Tx power obtained using each of the PA in the first FEM and the PA in the second FEM. The electronic device may include at least one processor. At least one processor may be configured to transmit, via the third antenna, a signal with a Tx power obtained using the PA in the third FEM operating based on the voltage provided from the first power supply circuit and the voltage provided from the second power supply circuit. At least one processor may be configured to, while the signal is transmitted via the third antenna, disconnect the PA in the first FEM from the first power supply circuit and disconnect the PA in the second FEM from the second power supply circuit. For example, the at least one component may be used for the disconnection. The at least one component may be illustrated in more detail within description of FIGS. 4 to 10.

Figure 4:
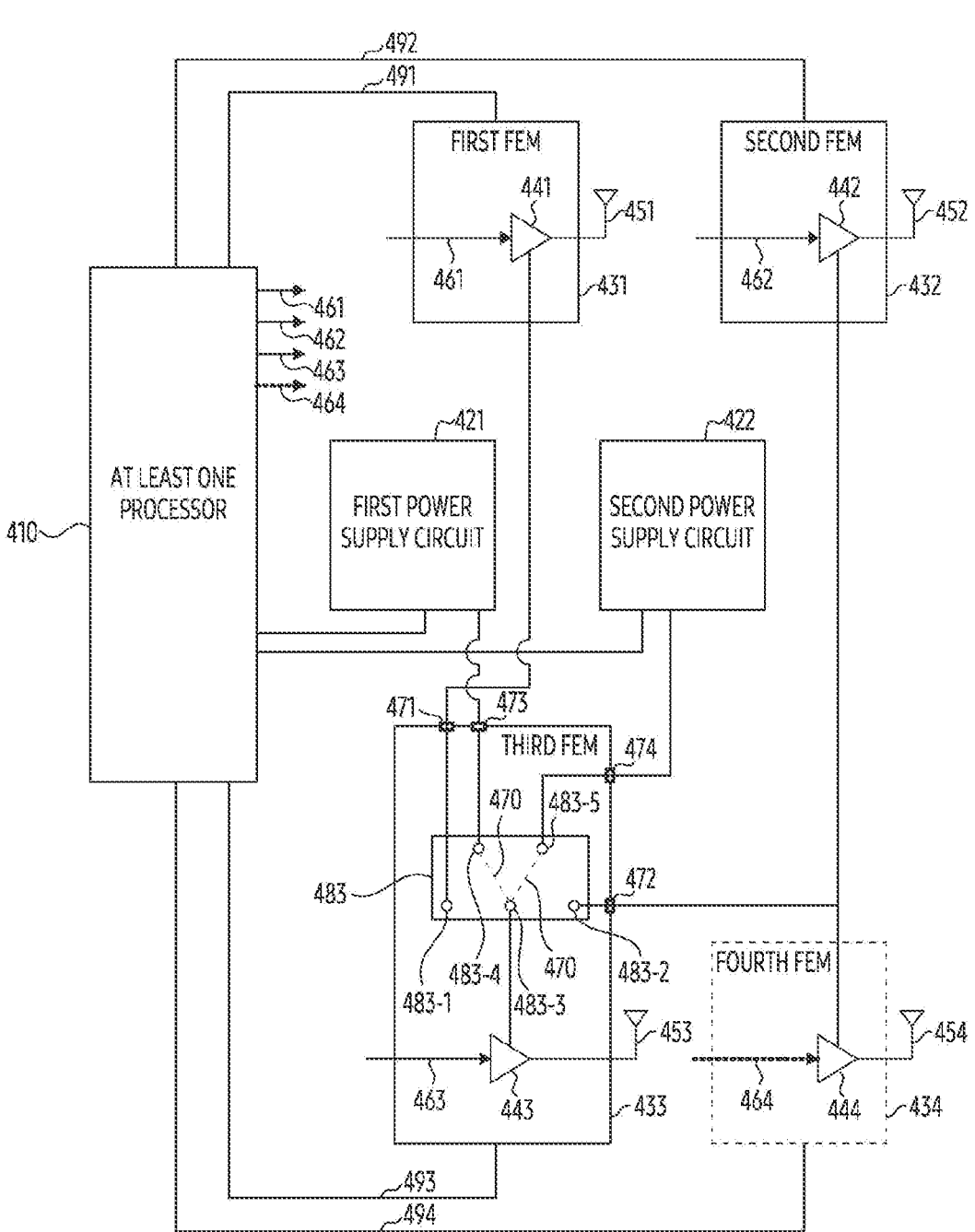
FIG. 4 illustrates an exemplary electronic device including a switch configured to block that a voltage provided to a PA in a third FEM from a power supply circuit is provided to each of a first FEM and a second FEM, in the third FEM.

FIG. 4 illustrates an exemplary electronic device including a switch configured to block that a voltage provided to a PA in a third FEM from a power supply circuit is provided to each of a first FEM and a second FEM, in the third FEM.

Referring to FIG. 4, an electronic device 400 may include at least one processor (e.g., including processing circuitry) 410, a plurality of power supply circuits including a first power supply circuit 421 and a second power supply circuit 422, a plurality of FEMs including a first FEM 431, a second FEM 432, and a third FEM 433, and a plurality of antennas including a first antenna 451, a second antenna 452, and a third antenna 453. For example, the plurality of FEMs may further include a fourth FEM 434. For example, the plurality of antennas may further include a fourth antenna 454. For example, the plurality of FEMs may include at least a part of a wireless communication module (e.g., including communication circuitry) 1292 of FIG. 12. For example, the plurality of power supply circuits may include at least part of a power management module (e.g., including power supply circuitry) 1288 of FIG. 12. For example, each of the plurality of power supply circuits may include a circuit for providing or setting a voltage based on average power tracking (APT) and/or a circuit for providing or setting a voltage based on envelope tracking (ET).

For example, the at least one processor 410 may include various processing circuitry. For example, as used herein, including the claims, the term "processor" may include various processing circuitry, including at least one processor, wherein one or more of at least one processor may be configured to perform various functions described herein. Additionally, the at least one processor may include a combination of processors performing various of the recited/disclosed functions. At least one processor may execute program instructions to achieve or perform various functions. At least one processor 410 may be configured to generate or obtain one or more signals (e.g., a signal 461, a signal 462, and/or a signal 463) to be transmitted via the first antenna 451, the second antenna 452, and/or the third antenna 453. For example, obtaining the one or more signals may indicate that the at least one processor 410 receives the one or more signals from another component of the electronic device 400, which is distinct from the at least one processor 410 and/or indicate that the at least one processor 410 generates the one or more signals without using other components of the electronic device 400.

Figure 12:
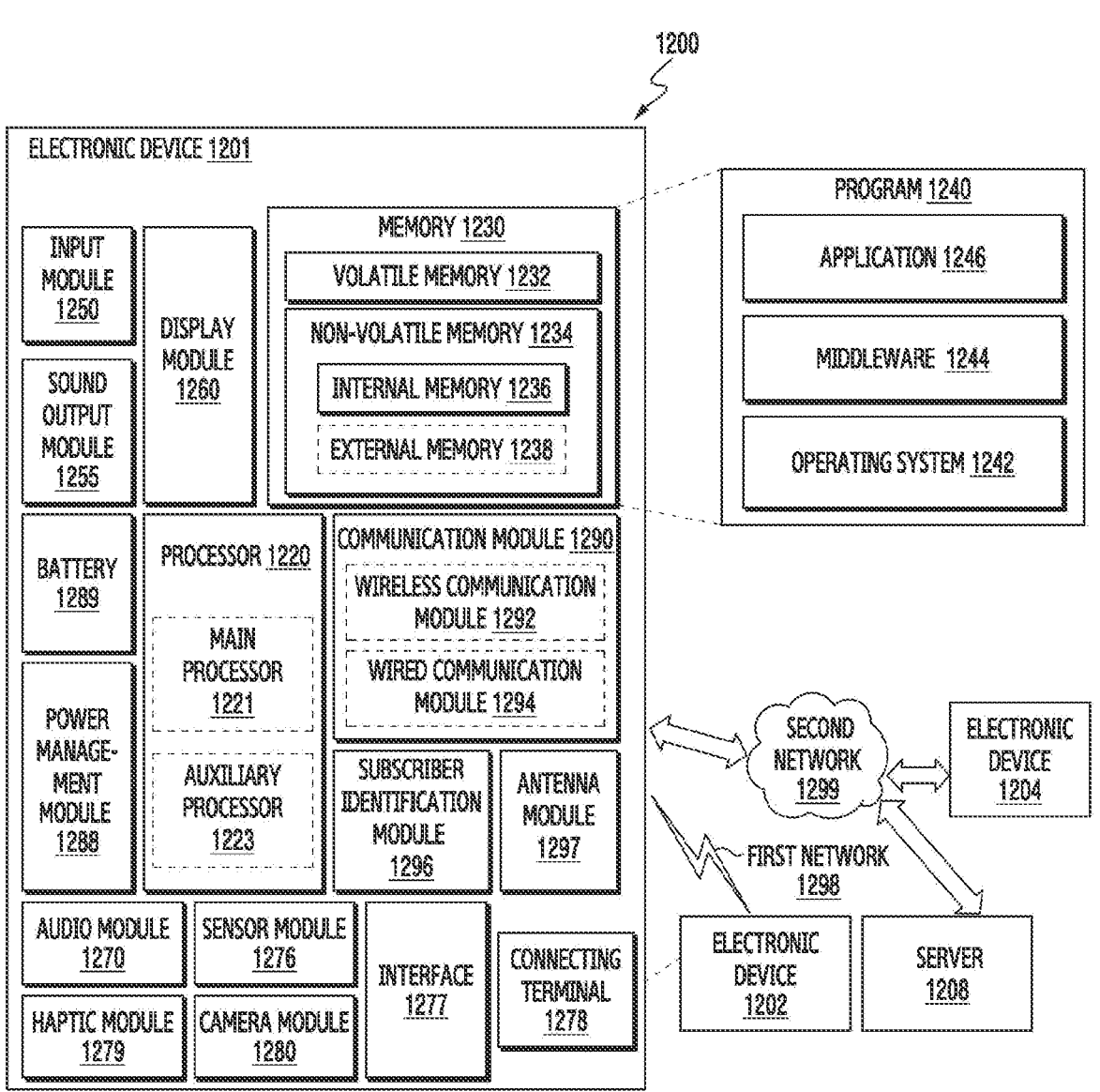
FIG. 12 is a block diagram of an electronic device in a network environment, according to various embodiments.

For example, the at least one processor 410 may include at least a part of a processor 1220 of FIG. 12. As a non-limiting example, the at least one processor 410 may include an application processor, a communication processor, and/or a transceiver. For example, the at least one processor 410 may control at least part of operations of the plurality of power supply circuits and the plurality of FEMs.

For example, at least one processor 410 may be operably (or operatively) coupled with each of the plurality of power supply circuits. Operably being coupled of the at least one processor 410 with each of the plurality of power supply circuits may indicate that the at least one processor 410 is directly connected to each of the plurality of power supply circuits. Operably being coupled of the at least one processor 410 with each of the plurality of power supply circuits may indicate that the at least one processor 410 is connected to each of the plurality of power supply circuits through at least one other component. Operably being coupled of the at least one processor 410 with each of the plurality of power supply circuits may indicate that the at least one processor 410 provides or transmits a control signal and/or a control command to each of the plurality of power supply circuits to control each of the plurality of power supply circuits.

For example, at least one processor 410 may be operably (or operatively) coupled with each of the plurality of FEMs. Operably being coupled of the at least one processor 410 with each of the plurality of FEMs may indicate that the at least one processor 410 is directly connected to each of the FEMs. Operably being coupled of the at least one processor 410 with each of the plurality of FEMs may indicate that the at least one processor 410 is connected to each of the FEMs through at least one other component. Operably being coupled of the at least one processor 410 with each of the plurality of FEMs may indicate that the at least one processor 410 provides or transmits a control signal and/or a control command to each of the plurality of power supply circuits to control each of the plurality of FEMs. For example, a first path 491, a second path 492, a third path 493, and/or a fourth path 494 may be used to provide the control signal and/or the control command. As a non-limiting example, the first path 491, the second path 492, the third path 493, and/or the fourth path 494 may include a mobile industry processor interface (MIPI). As a non-limiting example, the control signal and/or the control command may be used to change a state of a switch 483 in the third FEM 433.

For example, the at least one processor 410 may obtain a signal 461 to be transmitted through the first antenna 451 using the first FEM 431. For example, the at least one processor 410 may control the first power supply circuit 421 to provide a PA 441 with a voltage (e.g., collector supply voltage (Vcc)) for a dynamic range of the PA 441. For example, the at least one processor 410 may provide the signal 461 to the first FEM 431. For example, the signal 461 may be transmitted through the first antenna 451 with a Tx power obtained using the PA 441 operating based on the voltage. The Tx power may be identified by the at least one processor 410.

For example, the at least one processor 410 may obtain a signal 462 to be transmitted through the second antenna 452 using the second FEM 432. For example, the at least one processor 410 may control the second power supply circuit 422 to provide a PA 442 with a voltage for a dynamic range of the PA 442. For example, the voltage for the dynamic range may indicate a voltage provided (or supplied) to the PA 442 to obtain Tx power. For example, the at least one processor 410 may provide the signal 462 to the second FEM 432. For example, the signal 462 may be transmitted through the second antenna 452 with a Tx power obtained using the PA 442 operating based on the voltage. The Tx power may be identified by the at least one processor 410.

For example, the at least one processor 410 may obtain a signal 463 to be transmitted through the third antenna 453 using the third FEM 433. For example, the at least one processor 410 may control the first power supply circuit 421 to provide a PA 443 with a voltage for a dynamic range of the PA 443. For example, the at least one processor 410 may control the second power supply circuit 422 to provide the PA 443 with the voltage for the dynamic range of the PA 443. For example, the at least one processor 410 may provide the signal 463 to the third FEM 433. For example, the signal 463 may be transmitted through the third antenna 453 with a Tx power obtained using the PA 443 operating based on the voltage. The Tx power may be identified by the at least one processor 410.

For example, a range (e.g., about 37 decibel milliwatts (dBm) or about 31 dBm) of the Tx power obtained using the PA 443 may be higher than a range (e.g., max 23 dBm) of the Tx power obtained using the PA 441 and a range (e.g., max 23 dBm) of the Tx power obtained using the PA 442. For example, since the signal 463 is transmitted to a satellite unlike the signal 461 and the signal 462 transmitted to a base station and/or a user equipment, the range of the Tx power obtained using PA the 443 may be higher than the range of the Tx power obtained using the PA 441 and the range of the Tx power obtained using the PA 442. For example, the signal 463 may be used for a save our ship (SOS) service (or emergency service). For example, since the signal 463 is transmitted for a coverage wider than respective coverage of the signal 461 and the signal 462, the range of the Tx power obtained using the PA 443 may be higher than the range of the Tx power obtained using the PA 441 and the range of the Tx power obtained using the PA 442. For example, since the signal 463 is transmitted for coverage expansion, the range of the Tx power obtained using the PA 443 may be higher than the range of the Tx power obtained using the PA 441 and the range of the Tx power obtained using the PA 442.

For example, since intensity of a current used to obtain the Tx power of the signal 463 transmitted through the third antenna 453 using the PA 443 is higher than a maximum size of a current capable of being obtained from one of the first power supply circuit 421 and the second power supply circuit 422, the first power supply circuit 421 and the second power supply circuit 422 may be connected in parallel to the PA 443 for the Tx power of the signal 463 transmitted through the third antenna 453. For example, the voltage from the first power supply circuit 421 and the voltage from the second power supply circuit 422 may be provided to obtain the Tx power of the signal 463.

As a non-limiting example, since a range of the Tx power obtained using the PA 443 is higher than a range of the Tx power obtained using the PA 441 and a range of the Tx power obtained using the PA 442, a voltage for the dynamic range of the PA 443 may be higher than a voltage for dynamic ranges each of the PA 441 and the PA 442. As a non-limiting example, a maximum voltage that each of the PA 441 and the PA 442 may obtain for Tx power of each of the signal 461 and the signal 462 may be lower than a maximum voltage that the PA 443 may obtain for the Tx power of the signal 463. For example, absolute maximum rating (AMR) of each of the PA 441 and the PA 442 may be lower than AMR of the PA 443. For example, since the Tx power obtained using the PA 443 is higher than each of the Tx power obtained using the PA 441 and the PA 442, a voltage provided to the PA 443 may be higher than a voltage provided to the PA 441 and the PA 442.

For example, since the maximum operating voltage of the PA 443 is higher than a maximum voltage that may be obtained by each of the PA 441 and the PA 442, each of the PA 441 and the PA 442 in a disabling state may be damaged when the voltage provided to the PA 443 from the first power supply circuit 421 and the second power supply circuit 422 is obtained for transmitting the signal 463 through the third antenna 453. For example, the disabling states of each of the PA 441 and the PA 442 may include off state of each of the PA 441 and the PA 442. For example, the disabling state of each of the PA 441 and the PA 442 may include a state in which each of the signal 461 and the signal 462 are not transmitted using each of the PA 441 and the PA 442.

For example, the electronic device 400 may include the switch 483 in the third FEM 433 as at least one component to reduce probability in which the damage of each of the PA 441 and the PA 442 occur.

For example, the switch 483 may include a first electrode 483-1 connected to the PA 441, a second electrode 483-2 connected to the PA 442, a third electrode 483-3 connected to the PA 443, a fourth electrode 483-4 connected to the first power supply circuit 421, and/or a fifth electrode 483-5 connected to the second power supply circuit 422.

For example, the at least one processor 410 may transmit, through the third antenna 453, the signal 463 with a Tx power obtained using the PA 443 operating based on the voltage from the first power supply circuit 421 and the voltage from the second power supply circuit 422. For example, the at least one processor 410 may set a state of the switch 483 to a state 470 while the signal 463 is transmitted through the third antenna 453. For example, by controlling the switch 483 to connect the fourth electrode 483-4 to the third electrode 483-3 from among the first electrode 483-1 and the third electrode 483-3 and connect the fifth electrode 483-5 to the third electrode 483-3 from among the second electrode 483-2 and the third electrode 483-3 while the signal 463 is transmitted through the third antenna 453, the at least one processor 410 may disconnect the PA 441 from the first power supply circuit 421 (and the second power supply circuit 422), disconnect the PA 442 from the second power supply circuit 422 (and the first power supply circuit 421), and provide the PA 443 with the voltage from the first power supply circuit 421 and the second power supply circuit 422 for the transmission of the signal 463. For example, since the PA 441 is disconnected from the first power supply circuit 421 (and the second power supply circuit 422) and the PA 442 is disconnected from the second power supply circuit 422 (and the first power supply circuit 421) while the switch 483 is in the state 470, probability of the PA 441 and the PA 442 being damaged by the voltage from the first power supply circuit 421 and the second power supply circuit 422 may be reduced.

For example, when the electronic device 400 may include the fourth FEM 434, the at least one processor 410 may disconnect the PA 444 from the second power supply circuit 422 (and the first power supply circuit 421) by setting the state of the switch 483 to the state 470. For example, since the PA 444 is disconnected from the second power supply circuit 422 (and the first power supply circuit 421), probability of the PA 444 being damaged by the voltage from the first power supply circuit 421 and the second power supply circuit 422 may be reduced.

For example, the at least one processor 410 may control the switch 483 to connect the fourth electrode 483-4 to the first electrode 483-1 from among the first electrode 483-1 and the third electrode 483-3 while the signal 461 is transmitted through the first antenna 451. For example, the at least one processor 410 may control the switch 483 to connect the fourth electrode 483-4 to the first electrode 483-1 while the signal 461 is transmitted through the first antenna 451. For example, when the first electrode 483-1 is connected to the fourth electrode 483-4 for transmission of the signal 461, the fourth electrode 483-4 may be further connected to the third electrode 483-3. For example, when the fourth electrode 483-4 is connected to the third electrode 483-3, the at least one processor 410 may refrain from connecting the fifth electrode 483-5 to the third electrode 483-3.

For example, the at least one processor 410 may control the switch 483 to connect the fifth electrode 483-5 to the second electrode 483-2 from among the second electrode 483-2 and the third electrode 483-3 while the signal 462 is transmitted through the second antenna 452. For example, the at least one processor 410 may control the switch 483 to connect the fifth electrode 483-5 to the second electrode 483-2 while the signal 462 is transmitted through the second antenna 452. For example, when the second electrode 483-2 is connected to the fifth electrode 483-5 for transmission of the signal 462, the fifth electrode 483-5 may be further connected to the third electrode 483-3. For example, when the fifth electrode 483-5 is connected to the third electrode 483-3, the at least one processor 410 may refrain from connecting the fourth electrode 483-4 to the third electrode 483-3.

For example, the third FEM 433 may include pins connected to the switch 483. For example, each of the pins may be referred to as a pad or a connecting unit. For example, the pins may include a first pin 471 connected to the first electrode 483-1, a second pin 472 connected to the second electrode 483-2, a third pin 473 connected to the fourth electrode 483-4, and a fourth pin 474 connected to the fifth electrode 483-5. For example, the PA 441 may be connected to the first electrode 483-1 through the first pin 471, the PA 442 may be connected to the second electrode 483-2 through the second pin 472, the first power supply circuit 421 may be connected to the fourth electrode 483-4 through the third pin 473, and the second power supply circuit 422 may be connected to the fifth electrode 483-5 through the fourth pin 474.

As described above, by including the switch 483 in the third FEM 433, the electronic device 400 may reduce the damage to each of the PA 441 and the PA 442, which may be caused by sharing the first power supply circuit 421 or the second power supply circuit 422 with the PA 443.

Figure 5:
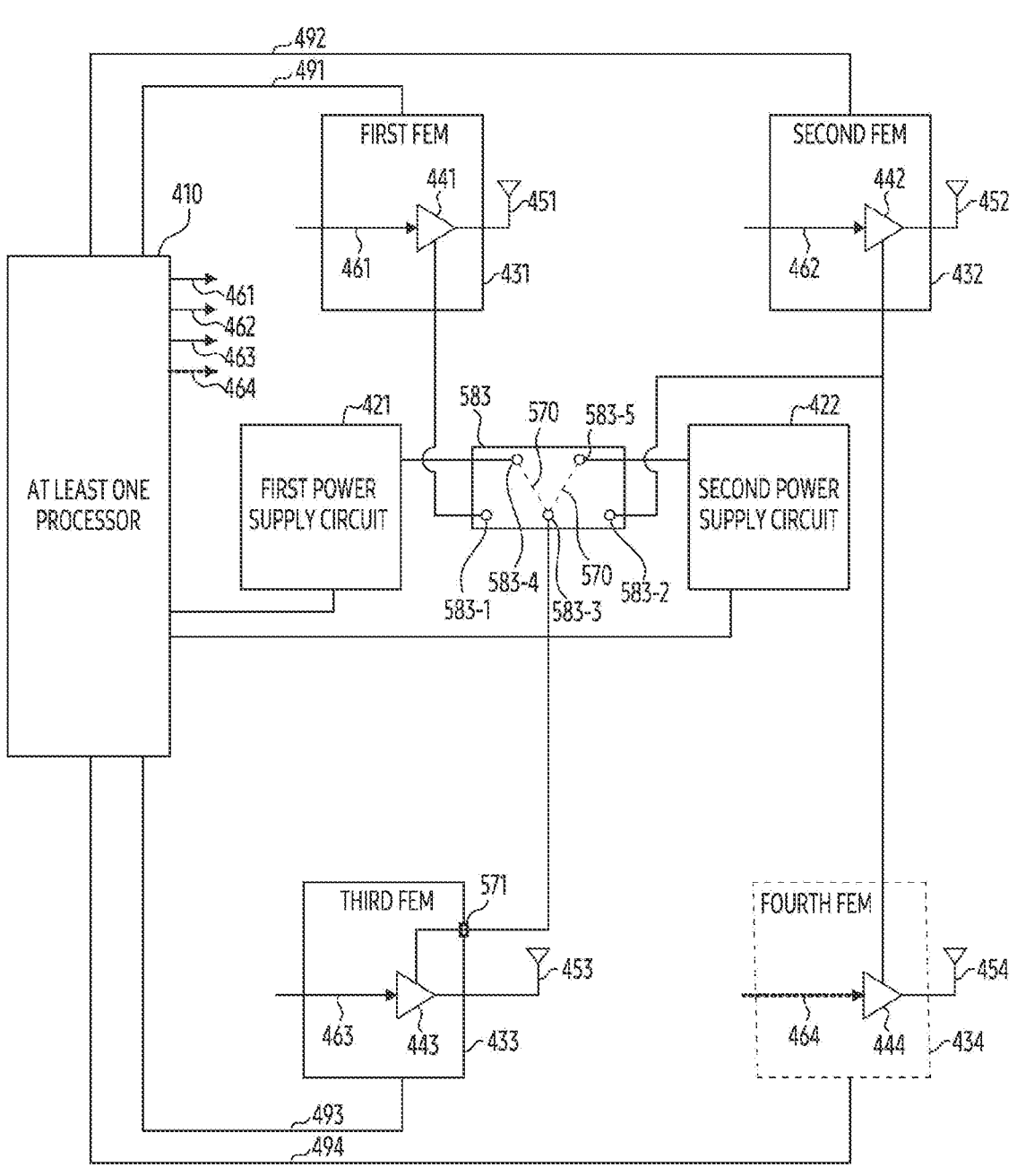
FIG. 5 illustrates an exemplary electronic device including a switch configured to block that a voltage provided to a PA in a third FEM from a power supply circuit is provided to each of a first FEM and a second FEM, outside of the first FEM, the third FEM, and the third FEM.

FIG. 5 illustrates an exemplary electronic device including a switch configured to block that a voltage provided to a PA in a third FEM from a power supply circuit is provided to each of a first FEM and a second FEM, outside of the first FEM, the third FEM, and the third FEM.

Referring to FIG. 5, as compared to FIG. 4, an electronic device 500 may include a switch 583 positioned outside of the first FEM 431, the second FEM 432, and the third FEM 433 as at least one component. For example, the electronic device 500 may include the switch 583 that replaces the switch 483 of FIG. 4. For example, the switch 583 may include a first electrode 583-1 connected to the PA 441, a second electrode 583-2 connected to the PA 442, a third electrode 583-3 connected to the PA 443, a fourth electrode 583-4 connected to the first power supply circuit 421, and/or a fifth electrode 583-5 connected to the second power supply circuit 422.

For example, as compared to FIG. 4, a third FEM 433 of the electronic device 500 may not include the switch 483. For example, as compared to FIG. 4, the third FEM 433 of the electronic device 500 may not include the first pin 471, the second pin 472, the third pin 473, and the fourth pin 474. For example, as compared to FIG. 4, the third FEM 433 of the electronic device 500 may include a pin 571 connected to the third electrode 583-3 of the switch 583. For example, a PA 443 in the third FEM 433 of the electronic device 500 may be connected to the third electrode 583-3 through the pin 571.

For example, the at least one processor 410 may transmit, through the third antenna 453, the signal 463 with the Tx power obtained using the PA 443 operating based on the voltage from the first power supply circuit 421 and the voltage from the second power supply circuit 422. For example, the at least one processor 410 may set a state of the switch 583 to a state 570 while the signal 463 is transmitted through the third antenna 453. For example, by controlling the switch 583 to connect the fourth electrode 583-4 to the third electrode 583-3 from among the first electrode 583-1 and the third electrode 583-3 and connect the fifth electrode 583-5 to the third electrode 583-3 from among the second electrode 583-2 and the third electrode 583-3 while the signal 463 is transmitted through the third antenna 453, the at least one processor 410 may disconnect the PA 441 from the first power supply circuit 421 (and the second power supply circuit 422), disconnect the PA 442 from the second power supply circuit 422 (and the first power supply circuit 421), and provide the PA 443 with the voltage from the first power supply circuit 421 and the second power supply circuit 422 for the transmission of the signal 463. For example, since the PA 441 is disconnected from the first power supply circuit 421 (and the second power supply circuit 422) and the PA 442 is disconnected from the second power supply circuit 422 (and the first power supply circuit 421) while the switch 583 is in the state 570, probability of the PA 441 and the PA 442 being damaged by the voltage from the first power supply circuit 421 and the second power supply circuit 422 may be reduced.

For example, when the electronic device 500 includes the fourth FEM 434, the at least one processor 410 may disconnect the PA 444 from the second power supply circuit 422 (and the first power supply circuit 421) by setting the state of the switch 583 to the state 570. For example, since the PA 444 is disconnected from the second power supply circuit 422 (and the first power supply circuit 421), probability of the PA 444 being damaged by the voltage from the first power supply circuit 421 and the second power supply circuit 422 may be reduced.

For example, the at least one processor 410 may control the switch 583 to connect the fourth electrode 583-4 to the first electrode 583-1 from among the first electrode 583-1 and the third electrode 583-3 while the signal 461 is transmitted through the first antenna 451. For example, the at least one processor 410 may control the switch 583 to connect the fourth electrode 583-4 to the first electrode 583-1 while the signal 461 is transmitted through the first antenna 451. For example, when the first electrode 583-1 is connected to the fourth electrode 583-4 for transmission of the signal 461, the fourth electrode 583-4 may be further connected to the third electrode 583-3. For example, when the fourth electrode 583-4 is connected to the third electrode 583-3, the at least one processor 410 may refrain from connecting the fifth electrode 583-5 to the third electrode 583-3.

For example, the at least one processor 410 may control the switch 583 to connect the fifth electrode 583-5 to the second electrode 583-2 from among the second electrode 583-2 and the third electrode 583-3 while the signal 462 is transmitted through the second antenna 452. For example, the at least one processor 410 may control the switch 583 to connect the fifth electrode 583-5 to the second electrode 583-2 while the signal 462 is transmitted through the second antenna 452. For example, when the second electrode 583-2 is connected to the fifth electrode 583-5 for transmission of the signal 462, the fifth electrode 583-5 may be further connected to the third electrode 583-3. For example, when the fifth electrode 583-5 is connected to the third electrode 583-3, the at least one processor 410 may refrain from connecting the fourth electrode 583-4 to the third electrode 583-3.

As described above, by including the switch 583 that is positioned outside of the first FEM 431, the second FEM 432, and the third FEM 433, the electronic device 500 may reduce the damage to each of the PA 441 and the PA 442, which may be caused by sharing the first power supply circuit 421 or the second power supply circuit 422 with the PA 443.

Figure 6:
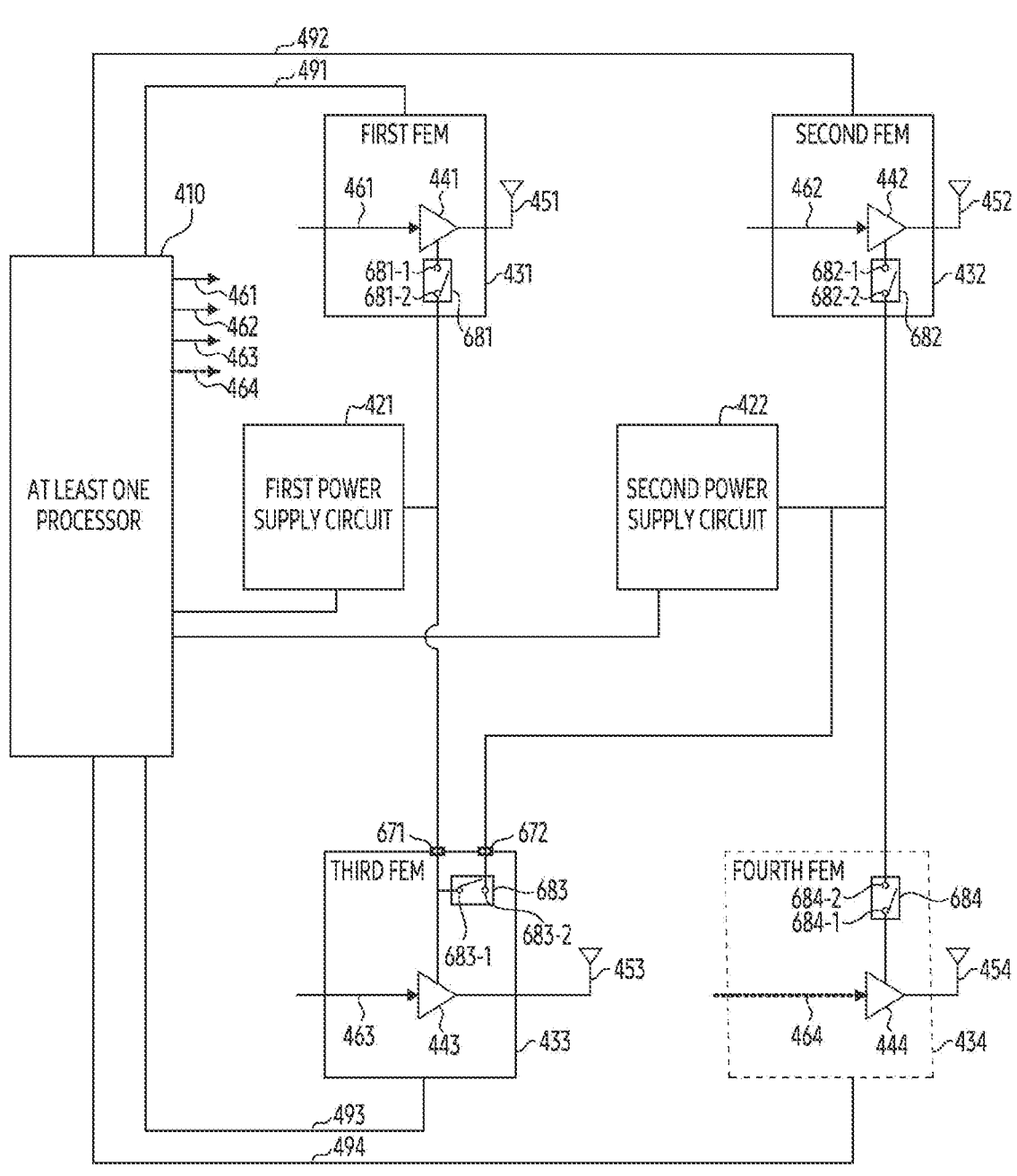
FIG. 6 illustrates an exemplary electronic device that includes each switches configured to block that a voltage provided to a PA in a third FEM from a power supply circuit is provided to each of a first FEM and a second FEM, in each of the first FEM and the second FEM.

FIG. 6 illustrates an exemplary electronic device that includes each switches configured to block that a voltage provided to a PA in a third FEM from a power supply circuit is provided to each of a first FEM and a second FEM, in each of the first FEM and the second FEM.

Referring to FIG. 6, an electronic device 600 may include a switch 681 included in the first FEM 431, a switch 682 included in the second FEM 432, and/or a switch 683 included in the third FEM 433 as the at least one component. For example, the electronic device 600 may include the switch 681, the switch 682, and/or the switch 683, which may at least functionally replace the switch 483 of FIG. 4.

For example, the switch 681 may include a first electrode 681-1 connected to the PA 441 and a second electrode 681-2 connected to the first power supply circuit 421. For example, the switch 682 may include a first electrode 682-1 connected to the PA 442 and a second electrode 682-2 connected to the second power supply circuit 422. For example, the switch 683 may include a first electrode 683-1 connected to each of the first power supply circuit 421 and the PA 443 and a second electrode 683-2 connected to the second power supply circuit 422. For example, the switch 683 may be configured to connect the PA 443 to the second power supply circuit 422 and disconnect the PA 443 from the second power supply circuit 422.

For example, as compared to FIG. 4, a third FEM 433 of the electronic device 600 may include the switch 683 instead of the switch 483. For example, as compared to FIG. 4, the third FEM 433 of the electronic device 600 may not include the first pin 471, the second pin 472, the third pin 473, and the fourth pin 474. For example, as compared to FIG. 4, the third FEM 433 of the electronic device 600 may include a first pin 671 connected to each of the first electrode 683-1 of the PA 443 and the switch 683 and a second pin 672 connected to the second electrode 683-2 of the switch 683. For example, the PA 443 in the third FEM 433 of the electronic device 600 may be connected to the first power supply circuit 421 through the first pin 671. For example, the second electrode 683-2 of the switch 683 may be connected to the second power supply circuit 422 through the second pin 672.

For example, the at least one processor 410 may transmit, through the third antenna 453, a signal 463 with the Tx power obtained using the PA 443 operating based on the voltage from the first power supply circuit 421 and the voltage from the second power supply circuit 422. For example, by controlling the switch 683 to connect the PA 443 to the second power supply circuit 422 for transmitting the signal 463 through the third antenna 453, the at least one processor 410 may provide the PA 443 with the voltage from the first power supply circuit 421 and the voltage from the second power supply circuit 422. For example, by controlling the switch 683 to connect the first electrode 683-1 to the second electrode 683-2, the at least one processor 410 may provide the PA 443 with the voltage from the first power supply circuit 421 and the voltage from the second power supply circuit 422 for transmission of the signal 463 through the third antenna 453.

For example, the at least one processor 410 may control the switch 681 to disconnect the PA 441 from the first power supply circuit 421 while the signal 463 is transmitted through the third antenna 453. For example, the at least one processor 410 may control the switch 681 to disconnect the first electrode 681-1 from the second electrode 681-2 while the signal 463 is transmitted through the third antenna 453.

For example, the at least one processor 410 may control the switch 682 to disconnect the PA 442 from the second power supply circuit 422 while the signal 463 is transmitted through the third antenna 453. For example, the at least one processor 410 may control the switch 682 to disconnect the first electrode 682-1 from the second electrode 682-2 while the signal 463 is transmitted through the third antenna 453.

For example, since the first electrode 681-1 of the switch 681 is disconnected from the second electrode 681-2 of the switch 681, and the first electrode 682-1 of the switch 682 is disconnected from the second electrode 682-2 of the switch 682, probability of the PA 441 and the PA 442 being damaged by the voltage from the first power supply circuit 421 and the voltage from the second power supply circuit 422 may be reduced.

For example, when the electronic device 600 includes the fourth FEM 434, the at least one processor 410 may control the switch 684 to disconnect the PA 444 from the second power supply circuit 422 while the signal 463 is transmitted through the third antenna 453. For example, the at least one processor 410 may control the switch 682 to disconnect the first electrode 684-1 connected to the PA 444 from the second electrode 684-2 connected to the second power supply circuit 422 while the signal 463 is transmitted through the third antenna 453. Since the PA 444 is disconnected from the second power supply circuit 422, probability of the PA 444 being damaged by the voltage from the first power supply circuit 421 and the voltage from the second power supply circuit 422 may be reduced.

For example, the at least one processor 410 may control the switch 681 to connect the second electrode 681-2 to the first electrode 681-1 while the signal 461 is transmitted through the first antenna 451. For example, the at least one processor 410 may control the switch 683 to disconnect the second electrode 683-2 from the first electrode 683-1 while the signal 461 is transmitted through the first antenna 451.

For example, the at least one processor 410 may control the switch 682 to connect the second electrode 682-2 to the first electrode 682-1 while the signal 462 is transmitted through the second antenna 452. For example, the at least one processor 410 may control the switch 683 to disconnect the second electrode 683-2 from the first electrode 683-1 while the signal 462 is transmitted through the second antenna 452.

As described above, by including each of the switch 681, the switch 682, and the switch 683 positioned in each of the first FEM 431, the second FEM 432, and the third FEM 433, the electronic device 600 may reduce damage to each of the PA 441 and the PA 442, which may be caused by sharing the first power supply circuit 421 or the second power supply circuit 422 with the PA 443.

Figure 7:
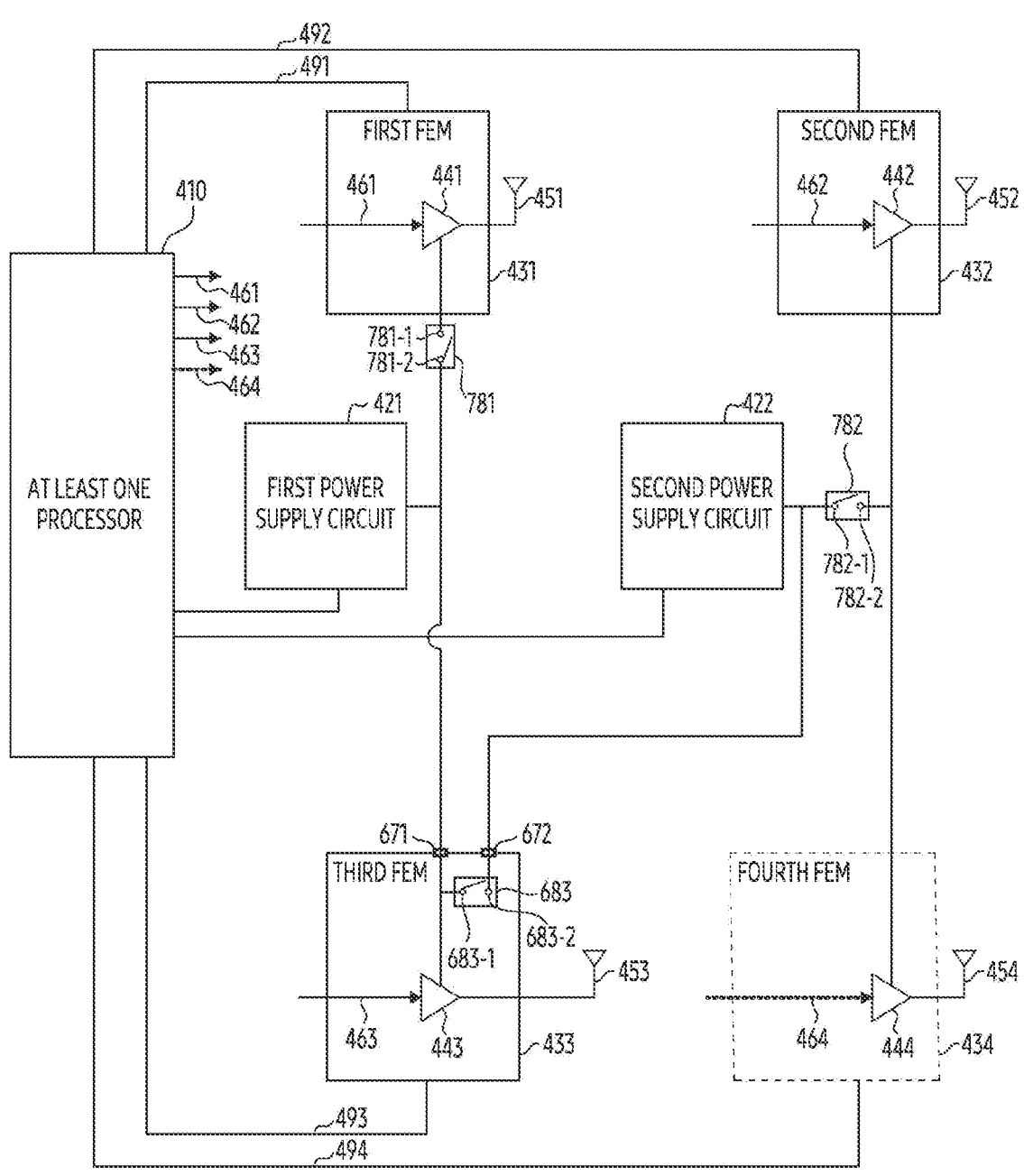
FIG. 7 illustrates an exemplary electronic device that includes switches for a first FEM and a second FEM configured to block that a voltage provided to a PA in a third FEM from a power supply circuit is provided to each of the first FEM and the second FEM, outside of the first FEM and the second FEM.

FIG. 7 illustrates an exemplary electronic device that includes switches for a first FEM and a second FEM configured to block that a voltage provided to a PA in a third FEM from a power supply circuit is provided to each of the first FEM and the second FEM, outside of the first FEM and the second FEM.

Referring to FIG. 7, as compared to the example illustrated in FIG. 6, an electronic device 700 may include a switch 781 positioned outside of the first FEM 431 and a switch 782 positioned outside of the second FEM 432, as the at least one component. For example, the electronic device 700 may include the switch 781 that replaces the switch 681 of FIG. 6 and the switch 782 that replaces the switch 682 of FIG. 6. For example, the switch 781 may include a first electrode 781-1 connected to the PA 441 and a second electrode 781-2 connected to the first power supply circuit 421. For example, the switch 782 may include a first electrode 782-1 connected to the PA 442 and a second electrode 782-2 connected to the second power supply circuit 422. For example, when the electronic device 700 includes the fourth FEM 434, the first electrode 782-1 may be further connected to the PA 444.

For example, the at least one processor 410 may transmit, through the third antenna 453, the signal 463 with the Tx power obtained using the PA 332 operating based on the voltage from the first power supply circuit 421 and the voltage from the second power supply circuit 422. For example, by controlling the switch 683 to connect the PA 443 to the second power supply circuit 422 to transmit the signal 463 through the third antenna 453, the at least one processor 410 may provide the PA 443 with the voltage from the first power supply circuit 421 and the voltage from the second power supply circuit 422. For example, by controlling the switch 683 to connect the first electrode 683-1 to the second electrode 683-2, the at least one processor 410 may provide the PA 443 with the voltage from the first power supply circuit 421 and the voltage from the second power supply circuit 422 to transmit the signal 463 through the third antenna 453.

For example, the at least one processor 410 may control the switch 781 to disconnect the PA 441 from the first power supply circuit 421 while the signal 463 is transmitted through the third antenna 453. For example, the at least one processor 410 may control the switch 781 to disconnect the first electrode 781-1 from the second electrode 781-2 while the signal 463 is transmitted through the third antenna 453.

For example, the at least one processor 410 may control the switch 782 to disconnect the PA 442 from the second power supply circuit 422 while the signal 463 is transmitted through the third antenna 453. For example, the at least one processor 410 may control the switch 782 to disconnect the first electrode 782-1 from the second electrode 782-2 while the signal 463 is transmitted through the third antenna 453.

For example, since the first electrode 781-1 of the switch 781 is disconnected from the second electrode 781-2 of the switch 781, and the first electrode 782-1 of the switch 782 is disconnected from the second electrode 782-2 of the switch 782 while signal 463 is being transmitted through third antenna 453, probability of the PA 441 and the PA 442 being damaged by the voltage from the first power supply circuit 421 and the voltage from the second power supply circuit 422 may be reduced.

For example, when the electronic device 700 includes the fourth FEM 434, the at least one processor 410 may control the switch 782 to disconnect the PA 444 from the second power supply circuit 422 while the signal 463 is transmitted through the third antenna 453. For example, the at least one processor 410 may control the switch 782 to disconnect the first electrode 782-1 connected to the PA 444 from the second electrode 782-2 connected to the second power supply circuit 422 while the signal 463 is transmitted through the third antenna 453. Since the PA 444 is disconnected from the second power supply circuit 422, probability of the PA 444 being damaged by the voltage from the first power supply circuit 421 and the voltage from the second power supply circuit 422 may be reduced.

For example, the at least one processor 410 may control the switch 781 to connect the second electrode 781-2 to the first electrode 781-1 while the signal 461 is transmitted through the first antenna 451. For example, the at least one processor 410 may control the switch 683 to disconnect the second electrode 683-2 from the first electrode 683-1 while the signal 461 is transmitted through the first antenna 451.

For example, the at least one processor 410 may control the switch 782 to connect the second electrode 782-2 to the first electrode 782-1 while the signal 462 is transmitted through the second antenna 452. For example, the at least one processor 410 may control the switch 683 to disconnect the second electrode 683-2 from the first electrode 683-1 while the signal 462 is transmitted through the second antenna 452.

As described above, by including the switch 781 positioned outside of the first FEM 431 and the switch 782 positioned outside of the second FEM 432, the electronic device 600 may reduce the damage to each of the PA 441 and the PA 442, which may be caused by sharing the first power supply circuit 421 or the second power supply circuit 422 with the PA 443.

Although FIG. 6 and FIG. 7 illustrate examples in which the switch 683 is included in the third FEM 433, the switch 683 may be positioned outside of the third FEM 433.

FIGS. 4, 5, 6 and 7 illustrate an electronic device including the at least one component (e.g., a switch) that disconnects each of a power supply path to the PA 441 and a power supply path to the PA 442 when the signal 463 is transmitted through the third antenna 453. The electronic device may include the at least one component configured to adjust the voltage provided to the PA 441 and the voltage provided to the PA 442. The at least one component may be illustrated in descriptions of FIGS. 8 and 9.

Figure 8:
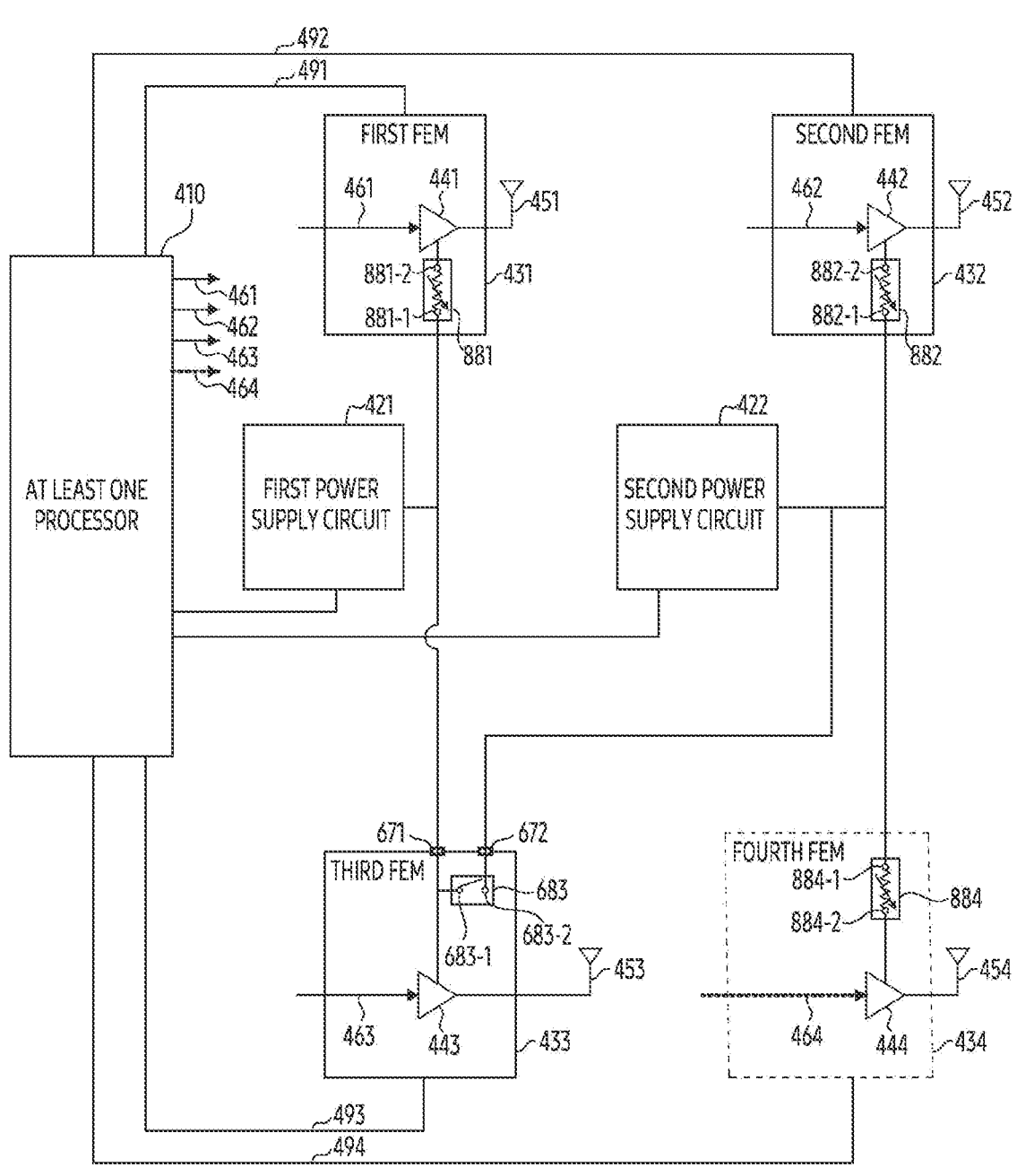
FIG. 8 illustrates an exemplary electronic device that includes each variable resistors for adjusting voltages provided to each of a first FEM and a second FEM from power supply circuits for a signal transmitted by using a third FEM, in each of the first FEM and the second FEM.

FIG. 8 illustrates an exemplary electronic device that includes each variable resistors for adjusting voltages provided to each of a first FEM and a second FEM from power supply circuits for a signal transmitted by using a third FEM, in each of the first FEM and the second FEM.

Referring to FIG. 8, as compared to the electronic device 400 of FIG. 4, an electronic device 800 may include a variable resistor 881 included in the first FEM 431 and a variable resistor 882 included in the second FEM 432 as the at least one component. For example, the electronic device 800 may include a switch 683, a first pin 671, and a second pin 672 in the third FEM 433 as the at least one component, such as the electronic device 600 of FIG. 6 and the electronic device 700 of FIG. 7. For example, the electronic device 800 may include the switch 683, the variable resistor 881, and the variable resistor 882 that replace the switch 483 of FIG. 4. For example, the variable resistor 881 may include a first electrode 881-1 connected to the first power supply circuit 421 and a second electrode 881-2 connected to the PA 441. For example, the variable resistor 881 may be configured to adjust voltage provided to the PA 441 from the first power supply circuit 421. For example, the variable resistor 882 may include a first electrode 882-1 connected to the second power supply circuit 422 and a second electrode 882-2 connected to the PA 442. For example, the variable resistor 882 may be configured to adjust the voltage provided to the PA 442 from the second power supply circuit 422.

For example, the at least one processor 410 may transmit the signal 463 through the third antenna 453 with the Tx power obtained using the PA 443 operating based on the voltage from the first power supply circuit 421 and the voltage from the second power supply circuit 422. For example, by controlling the switch 683 to connect the PA 443 to the second power supply circuit 422 to transmit the signal 463 through the third antenna 453, the at least one processor 410 may provide the PA 443 with the voltage from the first power supply circuit 421 and the voltage from the second power supply circuit 422. For example, by controlling the switch 683 to connect the first electrode 683-1 to the second electrode 683-2, the at least one processor 410 may provide the PA 443 with the voltage from the first power supply circuit 421 and the voltage from the second power supply circuit 422 to transmit the signal 463 through the third antenna 453.

For example, the at least one processor 410 may adjust, to a voltage lower than the voltage provided in accordance with the transmission of the signal 463 from the first power supply circuit 421 to the PA 443, a voltage provided in accordance with the transmission of the signal 463 from the first power supply circuit 421 to the PA 441. For example, the at least one processor 410 may adjust, to a voltage lower than a maximum operating voltage of the PA 441, a voltage provided in accordance with the transmission of the signal 463 from the first power supply circuit 421 to the PA 441. For example, the at least one processor 410 may reduce the voltage provided in accordance with the transmission of the signal 463 from the first power supply circuit 421 to the PA 441 by adjusting (or increasing) a resistance of the variable resistor 881.

For example, the at least one processor 410 may adjust, to a voltage lower than a voltage provided in accordance with the transmission of the signal 463 from the second power supply circuit 422 to the PA 443, a voltage provided in accordance with the transmission of the signal 463 from the second power supply circuit 422 to the PA 442. For example, the at least one processor 410 may adjust, to a voltage lower than a maximum operating voltage of the PA 442, a voltage provided in accordance with the transmission of the signal 463 from the second power supply circuit 422 to the PA 442. For example, the at least one processor 410 may reduce the voltage provided in accordance with the transmission of the signal 463 from the second power supply circuit 422 to the PA 442 by adjusting (or increasing) a resistance of the variable resistor 882.

For example, based on a control of the variable resistor 881 and a control of the variable resistor 882, probability of the PA 441 and the PA 442 being damaged by the voltage from the first power supply circuit 421 and the voltage from the second power supply circuit 422 may be reduced.

For example, when the electronic device 800 includes the fourth FEM 434, the at least one processor 410 may adjust, to a voltage lower than a voltage provided in accordance with the transmission of the signal 463 from the second power supply circuit 422 to the PA 443, a voltage provided in accordance with the transmission of the signal 463 from the second power supply circuit 422 to the PA 444. For example, the at least one processor 410 may adjust, to a voltage lower than a maximum operating voltage of the PA 444, a voltage provided in accordance with the transmission of the signal 463 from the second power supply circuit 422 to the PA 444. For example, the at least one processor 410 may reduce the voltage provided in accordance with the transmission of the signal 463 from the second power supply circuit 422 to the PA 444, by adjusting (or increasing) a resistance of the variable resistor 884 including the first electrode 884-1 connected to the second power supply circuit 422 and the second electrode 884-2 connected to the PA 444. For example, based on a control of the variable resistor 884, probability of the PA 444 being damaged by the voltage from the first power supply circuit 421 and the voltage from the second power supply circuit 422 may be reduced.

For example, the at least one processor 410 may adjust (or reduce) the resistance of the variable resistor 881 while the signal 461 is transmitted through the first antenna 451. For example, the resistance may be identified based on Tx power of the signal 461. For example, the at least one processor 410 may control the switch 683 to disconnect the second electrode 683-2 from the first electrode 683-1 while the signal 461 is transmitted through the first antenna 451.

For example, the at least one processor 410 may adjust (or reduce) the resistance of the variable resistor 882 while the signal 462 is transmitted through the second antenna 452. For example, the resistance may be identified based on Tx power of the signal 462. For example, the at least one processor 410 may control the switch 683 to disconnect the second electrode 683-2 from the first electrode 683-1 while the signal 462 is transmitted through the second antenna 452.

As described above, by including the variable resistor 881 positioned in the first FEM 431 and the variable resistor 882 positioned in the second FEM 432, the electronic device 800 may reduce damage to each of the PA 441 and PA the 442, which may be caused by sharing the first power supply circuit 421 or the second power supply circuit 422 with the PA 443.

Figure 9:
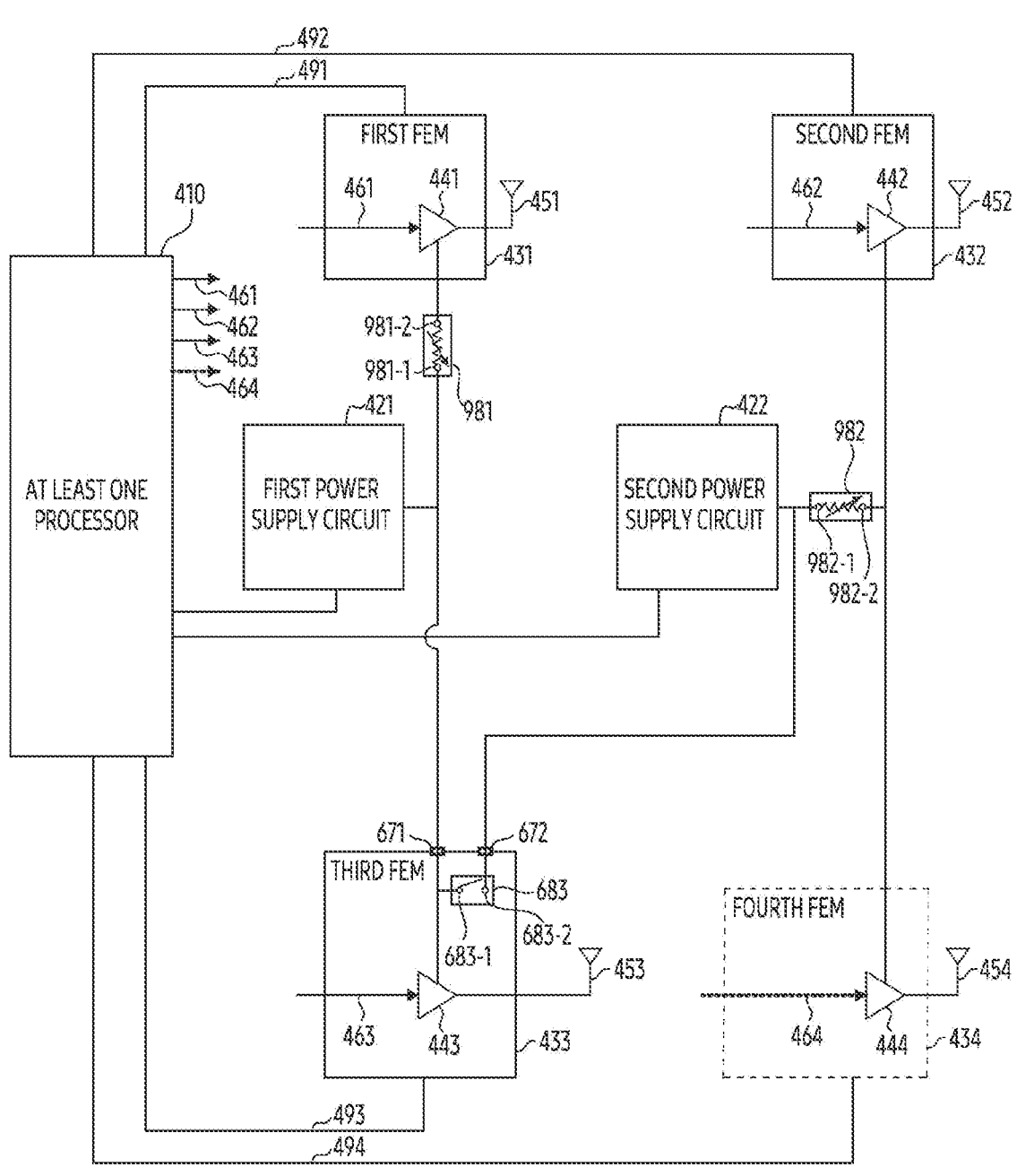
FIG. 9 illustrates an exemplary electronic device that includes variable resistors for adjusting voltages provided to each of a first FEM and a second FEM from power supply circuits for a signal transmitted by using a third FEM, outside of the first FEM and the second FEM.

FIG. 9 illustrates an exemplary electronic device that includes variable resistors for adjusting voltages provided to each of a first FEM and a second FEM from power supply circuits for a signal transmitted by using a third FEM, outside of the first FEM and the second FEM.

Referring to FIG. 9, as compared to the electronic device 800 of FIG. 8, an electronic device 900 may include a variable resistor 981 positioned outside of the first FEM 431 and a variable resistor 982 positioned outside of the second FEM 432 as the at least one component. For example, the electronic device 900 may include the variable resistor 981 that replaces the variable resistor 881 of FIG. 8 and the variable resistor 982 that replaces the variable resistor 882 of FIG. 8. For example, the variable resistor 981 may include a first electrode 981-1 connected to the first power supply circuit 421 and a second electrode 981-2 connected to the PA 441. For example, the variable resistor 981 may be configured to adjust a voltage provided to the PA 441 from the first power supply circuit 421. For example, the variable resistor 982 may include a first electrode 982-1 connected to the second power supply circuit 422 and a second electrode 982-2 connected to the PA 442. For example, the variable resistor 982 may be configured to adjust a voltage provided to the PA 442 from the second power supply circuit 422. For example, when the electronic device 900 includes the fourth FEM 434, the second electrode 982-2 may be further connected to the PA 444.

For example, the at least one processor 410 may transmit, through the third antenna 453, a signal 463 with the Tx power obtained using the PA 443 operating based on the voltage from the first power supply circuit 421 and the voltage from the second power supply circuit 422. For example, by controlling the switch 683 to connect the PA 443 to the second power supply circuit 422 to transmit the signal 463 through the third antenna 453, the at least one processor 410 may provide the PA 443 with the voltage from the first power supply circuit 421 and the voltage from the second power supply circuit 422. For example, by controlling the switch 683 to connect the first electrode 683-1 to the second electrode 683-2, the at least one processor 410 may provide the PA 443 with the voltage from the first power supply circuit 421 and the voltage from the second power supply circuit 422 to transmit the signal 463 through the third antenna 453.

For example, the at least one processor 410 may adjust, to a voltage lower than the voltage provided in accordance with the transmission of the signal 463 from the first power supply circuit 421 to the PA 443, a voltage provided in accordance with the transmission of the signal 463 from the first power supply circuit 421 to the PA 441. For example, the at least one processor 410 may adjust, to a voltage lower than a maximum operating voltage of the PA 441, the voltage provided in accordance with the transmission of the signal 463 from the first power supply circuit 421 to the PA 441. For example, the at least one processor 410 may reduce the voltage provided in accordance with the transmission of the signal 463 from the first power supply circuit 421 to the PA 441 by adjusting (or increasing) a resistance of the variable resistor 981.

For example, the at least one processor 410 may adjust, to a voltage lower than a voltage provided in accordance with the transmission of the signal 463 from the second power supply circuit 422 to the PA 443, a voltage provided in accordance with the transmission of the signal 463 from the second power supply circuit 422 to the PA 442. For example, the at least one processor 410 may adjust, to a voltage lower than a maximum operating voltage of the PA 442, a voltage provided in accordance with the transmission of the signal 463 from the second power supply circuit 422 to the PA 442. For example, the at least one processor 410 may reduce the voltage provided in accordance with the transmission of the signal 463 from the second power supply circuit 422 to the PA 442 by adjusting (or increasing) a resistance of the variable resistor 982.

For example, based on a control of the variable resistor 981 and a control of the variable resistor 982, probability of the PA 441 and the PA 442 being damaged by the voltage from the first power supply circuit 421 and the voltage from the second power supply circuit 422 may be reduced.

For example, when the electronic device 900 includes the fourth FEM 434, the at least one processor 410 may adjust, to a voltage lower than a voltage provided in accordance with the transmission of the signal 463 from the second power supply circuit 422 to the PA 443, a voltage provided in accordance with the transmission of the signal 463 from the second power supply circuit 422 to the PA 444. For example, the at least one processor 410 may adjust, to a voltage lower than a maximum operating voltage of the PA 444, a voltage provided in accordance with the transmission of the signal 463 from the second power supply circuit 422 to the PA 444. For example, the at least one processor 410 may reduce the voltage provided in accordance with the transmission of the signal 463 from the second power supply circuit 422 to the PA 444, by adjusting (or increasing) a resistance of the variable resistor 982. For example, based on a control of the variable resistor 982, probability of the PA 444 being damaged by the voltage from the first power supply circuit 421 and the voltage from the second power supply circuit 422 may be reduced.

For example, the at least one processor 410 may adjust (or reduce) the resistance of the variable resistor 981 while the signal 461 is transmitted through the first antenna 451. For example, the resistance may be identified based on Tx power of the signal 461. For example, the at least one processor 410 may control the switch 683 to disconnect the second electrode 683-2 from the first electrode 683-1 while the signal 461 is transmitted through the first antenna 451.

For example, the at least one processor 410 may adjust (or reduce) the resistance of the variable resistor 982 while the signal 462 is transmitted through the second antenna 452. For example, the resistance may be identified based on Tx power of the signal 462. For example, the at least one processor 410 may control the switch 683 to disconnect the second electrode 683-2 from the first electrode 683-1 while the signal 462 is transmitted through the second antenna 452.

As described above, by including the variable resistor 981 positioned outside of the first FEM 431 and the variable resistor 982 positioned outside of the second FEM 432, the electronic device 900 may reduce the damage to each of PA 441 and PA 442, which may be caused by sharing the first power supply circuit 421 or the second power supply circuit 422 with the PA 443.

Although FIGS. 8 and 9 illustrate an example in which the switch 683 is included in the third FEM 433, the switch 683 may be positioned outside of the third FEM 433.

FIGS. 4, 5, 6, 7, 8 and 9 illustrate an electronic device in which both the first power supply circuit 421 and the second power supply circuit 422 provide power to the PA 443 for the signal 463 to be transmitted through the third antenna 453. The PA 443 in the electronic device may obtain a voltage from one power supply circuit from among the first power supply circuit 421 and the second power supply circuit 422 for the signal 463 to be transmitted through the third antenna 453. For example, the power supply circuit may have ability to provide a current used to obtain the Tx power of the signal 463. The electronic device including the power supply circuit may be illustrated in description of FIG. 10.

Figure 10:
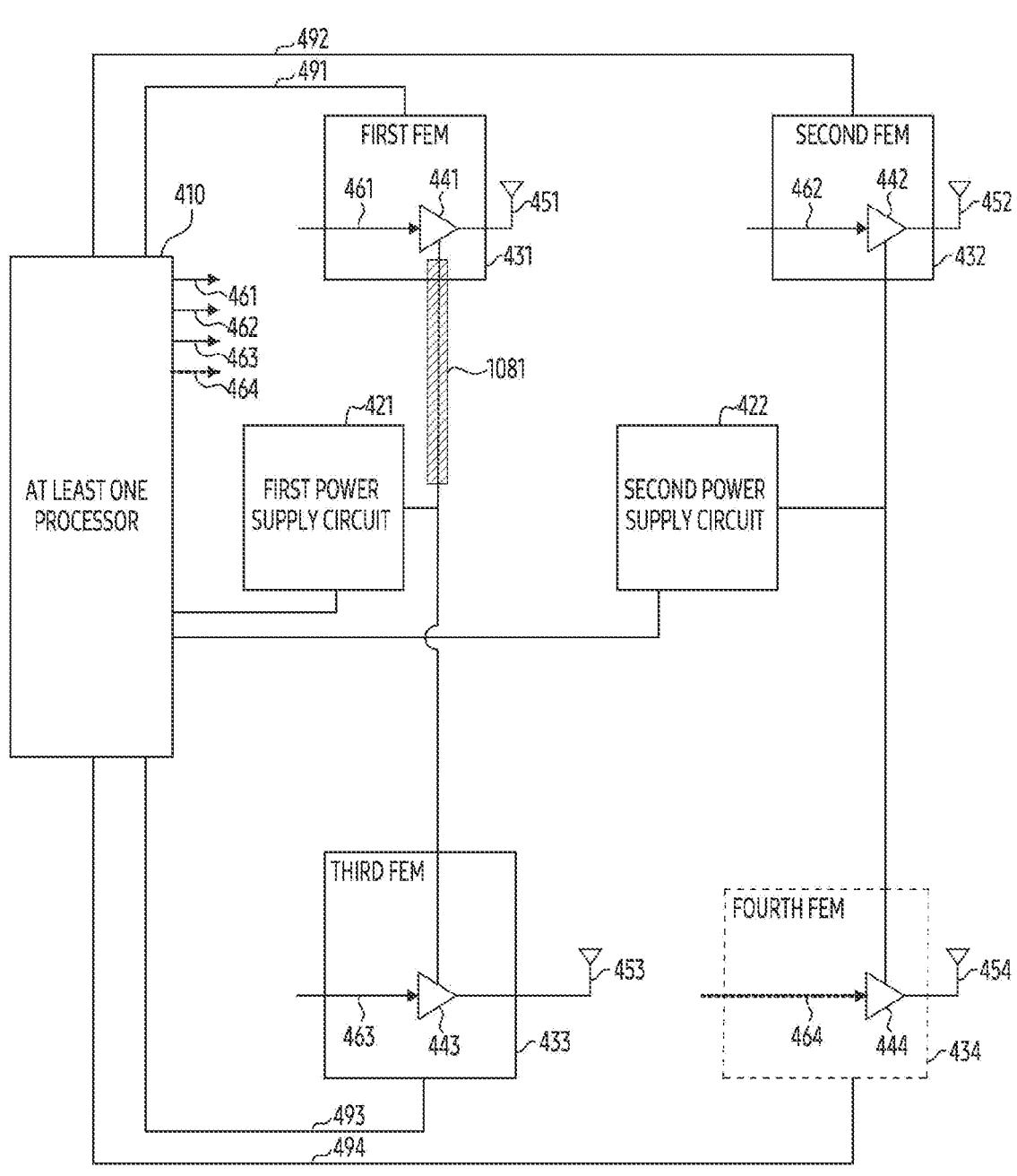
FIG. 10 illustrates an exemplary electronic device including a component for adjusting a voltage provided to a first FEM from a power supply circuit for a signal transmitted by using a third FEM.

FIG. 10 illustrates an exemplary electronic device including a component for adjusting a voltage provided to a first FEM from a power supply circuit for a signal transmitted by using a third FEM.

Referring to FIG. 10, compared to each of electronic devices of FIGS. 4 to 9, an electronic device 1000 may provide a voltage to the PA 443 using the first power supply circuit 421 from among the first power supply circuit 421 and the second power supply circuit 422 to transmit the signal 463 through the third antenna 453. For example, since the electronic device 1000 provides a voltage to the PA 443 using the first power supply circuit 421 from among the first power supply circuit 421 and the second power supply circuit 422 to transmit the signal 463 through the third antenna 453, the electronic device 1000 may include the at least one component for adjusting the voltage provided to the PA 441 while transmitting the signal 463 through the third antenna 453, as compared to each of electronic devices of FIGS. 4 to 9. For example, providing a voltage from the second voltage supply circuit 422 to the PA 442 to transmit the signal 462 through the second antenna 452 and providing a voltage from the second voltage supply circuit 422 to the PA 444 to transmit the signal 464 through the fourth antenna 454 may be performed in the electronic device 1000, independently of whether a voltage is provided to the PA 443 using the first power supply circuit 421.

For example, the at least one processor 410 may transmit, through the third antenna 453, the signal 463 with the Tx power obtained using the PA 443 operating based on the voltage from the first power supply circuit 421.

For example, the at least one processor 410 may control the at least one component positioned on (or within) a path 1081 between the first power supply circuit 421 and the PA 441 to disconnect the PA 441 from the first power supply circuit 421 while the signal 463 is transmitted through the third antenna 453. For example, the at least one component may include a switch including a first electrode connected to the PA 441 and a second electrode connected to the first power supply circuit 421. For example, the at least one processor 410 may control the switch to disconnect the first electrode from the second electrode while the signal 463 is transmitted through the third antenna 453. For example, the switch may be positioned in the first FEM 431 or outside of the first FEM 431.

For example, the at least one processor 410 may control the switch to connect the first electrode to the second electrode to transmit the signal 461 through the first antenna 451.

For example, the at least one processor 410 may control the at least one component positioned on (or within) the path 1081 between the first power supply circuit 421 and PA 441, in order to adjust, to a voltage lower than the voltage provided in accordance with the transmission of the signal 463 from the first power supply circuit 421 to the PA 443, the voltage provided in accordance with the transmission of the signal 463 from the first power supply circuit 421 to the PA 441. For example, the at least one component may include a variable resistor that includes a first electrode connected to the PA 441 and a second electrode connected to the first power supply circuit 421. For example, the at least one processor 410 may change (or increase) a resistance of the variable resistor while the signal 463 is transmitted through the third antenna 453, in order to adjust, to a voltage lower than the maximum voltage of the PA 441, the voltage provided to the PA 441 from the first voltage supply circuit 421. For example, the variable resistor may be positioned in the first FEM 431, or outside of the first FEM 431.

For example, the at least one processor 410 may change (or reduce) a resistance of the variable resistor in order to transmit the signal 461 through the first antenna 451.

As described above, the electronic device 800 may reduce damage to the PA 441, which may be caused by sharing the first power supply circuit 421 with the PA 443, by including the at least one component positioned for the first FEM 431.

The processor 410 of the electronic device illustrated through the descriptions of FIGS. 4, 5, 6, 7, 8, 9 and 10 may transmit the signal 463 through the third antenna 453, based on a determined event. For example, the at least one processor 410 may obtain the signal 463 to be transmitted through the third antenna 453, based on a radio resource control (RRC) idle state of the electronic device that is maintained for a reference time. For example, in response to the RRC idle state maintained for the reference time, the at least one processor 410 may display a message indicating whether to transmit the signal 463 through the third antenna 453 on a display of the electronic device (e.g., the display module 1260 of FIG. 12). For example, the at least one processor 410 may obtain the signal 463 to be transmitted through the third antenna 453 in response to receiving a user input indicating to transmit the signal 463 through the message.

For example, the at least one processor 410 may obtain the signal to be transmitted via the third antenna 453 in response to the RRC idle state maintained for the reference time after data indicating an acceleration higher than a reference acceleration is obtained through the acceleration sensor (e.g., the sensor module 1276) of the electronic device. For example, use of the third FEM 433 may be enabled based on the RRC idle state of the electronic device maintained for the reference time.

For example, a component for controlling a voltage provided to the PA 441 and/or the PA 442 while the signal 463 is transmitted through the antenna 453 based on the Tx power obtained using the PA 443 in the third FEM 433 may be included in the electronic device (e.g., the electronic device 400, the electronic device 500, the electronic device 600, the electronic device 700, the electronic device 800, the electronic device 900, and/or the electronic device 1000). As a non-limiting example, the components may include an over voltage protection (OVP) circuit in the first FEM 431 and/or the second FEM 432 arranged with respect to the PA 441 and/or the PA 442.

Figure 11:
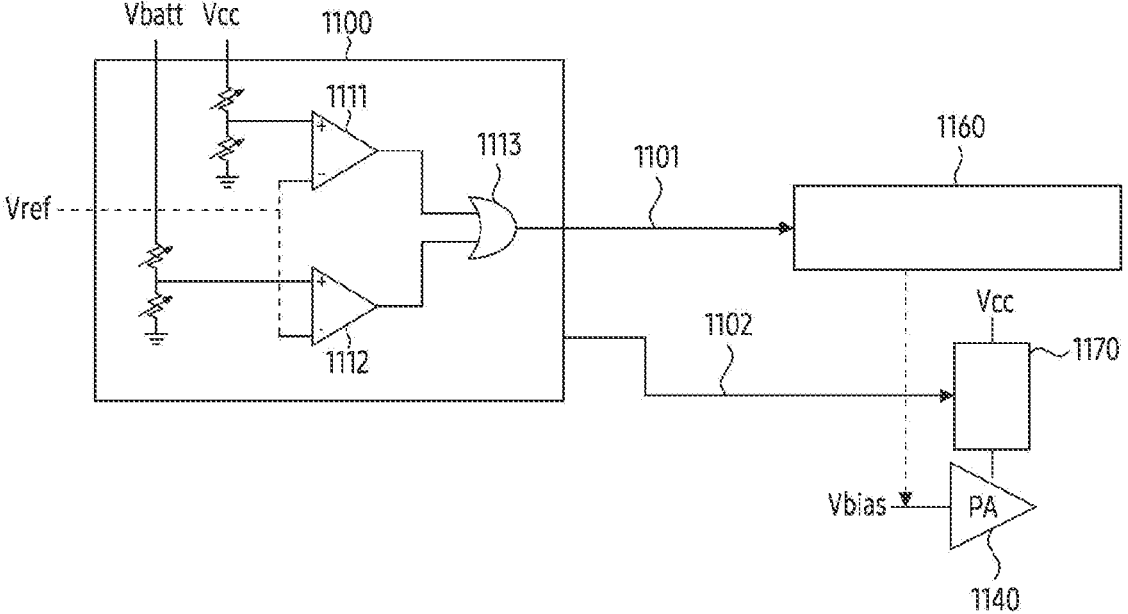
FIG. 11 illustrates an exemplary component that controls a voltage provided from each of power supply circuits to a PA in a third FEM for a signal transmitted by using the third FEM for a PA in a first FEM and/or a PA in a second FEM.

FIG. 11 illustrates an exemplary component that controls a voltage provided from each of power supply circuits to a PA in a third FEM for a signal transmitted by using the third FEM for a PA in a first FEM and/or a PA in a second FEM.

Referring to FIG. 11, an OVP circuit 1100 may be arranged with respect to a PA 1140 to obtain Tx power of a signal to be transmitted to an external electronic device. For example, the PA 1140 may include the PA 441 of FIG. 6, the PA 442 of FIG. 6, the PA 444 of FIG. 6, the PA 441 of FIG. 7, the PA 442 of FIG. 7, the PA 444 of FIG. 7, the PA 441 of FIG. 8, the PA 442 of FIG. 8, the PA 444 of FIG. 8, the PA 441 of FIG. 9, the PA 442 of FIG. 9, the PA 444 of FIG. 9, and/or the PA 441 of FIG. 10.

For example, the OVP circuit 1100 may be used to protect the PA 1140 while the PA 1140 is enabled. For example, the OVP circuit 1100 may be used to identify whether a voltage provided to the PA 1140 to obtain Tx power is higher than a reference voltage (e.g., Vref). For example, Vref, which is the reference voltage, may be set to protect the PA 1140.

For example, the OVP circuit 1100 may include a comparator 1111 to identify whether Vcc, which is the voltage, is higher than Vref. For example, the OVP circuit 1100 may include a comparator 1112 to identify whether Vbatt, which is another voltage provided to at least one power supply circuit (e.g., the first power supply circuit 421 and/or the second power supply circuit 422) to obtain Vcc is higher than Vref. For example, the OVP circuit 1100 may include an or gate 1113 for a signal provided from the OVP circuit 1100 to a circuit 1160. For example, the circuit 1160 may be used to provide Vbias, which is a bias voltage for the PA 1140.

For example, the comparator 1111 may compare Vcc with Vref. For example, the comparator 1111 may be configured to provide to the or gate 1113 a signal (e.g., a signal indicating '0') indicating that Vcc is lower than or equal to Vref when Vcc is lower than or equal to Vref as a result of the comparison. For example, the comparator 1111 may be configured to provide to the or gate 1113 a signal (e.g., a signal indicating '1') indicating that Vcc is higher than Vref when Vcc is higher than Vref as a result of the comparison.

For example, the comparator 1112 may compare Vbatt with Vref. For example, the comparator 1112 may be configured to provide to the or gate 1113 a signal (e.g., a signal indicating '0') indicating that Vbatt is lower than or equal to Vref when Vbatt is lower than or equal to Vref as a result of the comparison. For example, the comparator 1112 may be configured to provide to the or gate 1113 a signal (e.g., a signal indicating '1') indicating that Vbatt is higher than Vref when Vbatt is higher than Vref as a result of the comparison.

For example, the or gate 1113 may be configured to output a signal 1101 (e.g., a signal indicating '0') indicating to apply Vbias to a signal (e.g., a signal to be transmitted to an external electronic device) provided to the PA 1140, in response to Vcc lower than or equal to Vref and Vbatt lower than or equal to Vref. For example, the or gate 1113 may be configured to output a signal 1101 (e.g., a signal indicating '1') indicating to stop applying Vbias to a signal (e.g., a signal to be transmitted to an external electronic device) provided to the PA 1140, in response to Vcc higher than Vref and Vbatt higher Vref.

For example, the circuit 1160 may be configured to apply Vbias to a signal (e.g., a signal to be transmitted to an external electronic device) provided to the PA 1140, in response to the signal 1101 indicating to apply Vbias to the signal provided to the PA 1140. For example, the circuit 1160 may be configured to stop applying Vbias to a signal (e.g., a signal to be transmitted to an external electronic device) provided to the PA 1140, in response to the signal 1101 indicating to stop applying Vbias to a signal provided to PA 1140.

For example, the OVP circuit 1100 may be used to protect the PA 1140 while the PA 1140 is disabled. For example, the OVP circuit 1100 may be used to protect the PA 1140 while the signal 463 is transmitted through the third antenna 453. For example, the OVP circuit 1100 may be configured to provide a signal 1102 to a component 1170 on a path (or within) for a voltage provided to the PA 1140 while the PA 1140 is disabled and the signal 463 is transmitted through third antenna 453, based on a control signal (or control command) received from the at least one processor 410. For example, the component 1170 may include the switch 681 of FIG. 6, the switch 682 of FIG. 6, the switch 684 of FIG. 6, the switch 781 of FIG. 7, the switch 782 of FIG. 7, the switch 784 of FIG. 7, the variable resistor 881 of FIG. 8, the variable resistor 882 of FIG. 8, the variable resistor 884 of FIG. 8, the variable resistor 981 of FIG. 9, the variable resistor 982 of FIG. 9, the variable resistor 984 of FIG. 9, and the components on the path 1081 of FIG. 10. For example, the signal 1102 may be used to control the component 1170 (e.g., the switch 681 of FIG. 6, the switch 682 of FIG. 6, the switch 684 of FIG. 6, the switch 781 of FIG. 7, the switch 782 of FIG. 7, the switch 784 of FIG. 7, and/or the components on the path 1081 of FIG. 10) to block Vcc provided to the PA 1140. For example, the signal 1102 may be used to control the component 1170 (e.g., the variable resistor 881 of FIG. 8, the variable resistor 882 of FIG. 8, the variable resistor 884 of FIG. 8, the variable resistor 981 of FIG. 9, the variable resistor 982 of FIG. 9, the variable resistor 984 of FIG. 9, and/or the components on the path 1081 of FIG. 10) to adjust Vcc provided to the PA 1140 to a voltage lower than a maximum operating voltage of the PA 1140.

As described above, the OVP circuit 1100 may be used to protect the PA 1140 not only when the PA 1140 is enabled, but also when the PA 1140 is disabled. However, it is not limited thereto.

FIG. 12 is a block diagram illustrating an electronic device 1201 in a network environment 1200 according to various embodiments. Referring to FIG. 12, the electronic device 1201 in the network environment 1200 may communicate with an electronic device 1202 via a first network 1298 (e.g., a short-range wireless communication network), or at least one of an electronic device 1204 or a server 1208 via a second network 1299 (e.g., a long-range wireless communication network). According to an embodiment, the electronic device 1201 may communicate with the electronic device 1204 via the server 1208. According to an embodiment, the electronic device 1201 may include a processor 1220, memory 1230, an input module 1250, a sound output module 1255, a display module 1260, an audio module 1270, a sensor module 1276, an interface 1277, a connecting terminal 1278, a haptic module 1279, a camera module 1280, a power management module 1288, a battery 1289, a communication module 1290, a subscriber identification module (SIM) 1296, or an antenna module 1297. In various embodiments, at least one of the components (e.g., the connecting terminal 1278) may be omitted from the electronic device 1201, or one or more other components may be added in the electronic device 1201. In various embodiments, some of the components (e.g., the sensor module 1276, the camera module 1280, or the antenna module 1297) may be implemented as a single component (e.g., the display module 1260).

The processor 1220 may execute, for example, software (e.g., a program 1240) to control at least one other component (e.g., a hardware or software component) of the electronic device 1201 coupled with the processor 1220, and may perform various data processing or computation. According to one embodiment, as at least part of the data processing or computation, the processor 1220 may store a command or data received from another component (e.g., the sensor module 1276 or the communication module 1290) in volatile memory 1232, process the command or the data stored in the volatile memory 1232, and store resulting data in non-volatile memory 1234. According to an embodiment, the processor 1220 may include a main processor 1221 (e.g., a central processing unit (CPU) or an application processor (AP)), or an auxiliary processor 1223 (e.g., a graphics processing unit (GPU), a neural processing unit (NPU), an image signal processor (ISP), a sensor hub processor, or a communication processor (CP)) that is operable independently from, or in conjunction with, the main processor 1221. For example, when the electronic device 1201 includes the main processor 1221 and the auxiliary processor 1223, the auxiliary processor 1223 may be adapted to consume less power than the main processor 1221, or to be specific to a specified function. The auxiliary processor 1223 may be implemented as separate from, or as part of the main processor 1221.

The auxiliary processor 1223 may control at least some of functions or states related to at least one component (e.g., the display module 1260, the sensor module 1276, or the communication module 1290) among the components of the electronic device 1201, instead of the main processor 1221 while the main processor 1221 is in an inactive (e.g., sleep) state, or together with the main processor 1221 while the main processor 1221 is in an active state (e.g., executing an application). According to an embodiment, the auxiliary processor 1223 (e.g., an image signal processor or a communication processor) may be implemented as part of another component (e.g., the camera module 1280 or the communication module 1290) functionally related to the auxiliary processor 1223. According to an embodiment, the auxiliary processor 1223 (e.g., the neural processing unit) may include a hardware structure specified for artificial intelligence model processing. An artificial intelligence model may be generated by machine learning. Such learning may be performed, e.g., by the electronic device 1201 where the artificial intelligence is performed or via a separate server (e.g., the server 1208). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1230 may store various data used by at least one component (e.g., the processor 1220 or the sensor module 1276) of the electronic device 1201. The various data may include, for example, software (e.g., the program 1240) and input data or output data for a command related thereto. The memory 1230 may include the volatile memory 1232 or the non-volatile memory 1234.

The program 1240 may be stored in the memory 1230 as software, and may include, for example, an operating system (OS) 1242, middleware 1244, or an application 1246.

The input module 1250 may receive a command or data to be used by another component (e.g., the processor 1220) of the electronic device 1201, from the outside (e.g., a user) of the electronic device 1201. The input module 1250 may include, for example, a microphone, a mouse, a keyboard, a key (e.g., a button), or a digital pen (e.g., a stylus pen).

The sound output module 1255 may output sound signals to the outside of the electronic device 1201. The sound output module 1255 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1260 may visually provide information to the outside (e.g., a user) of the electronic device 1201. The display module 1260 may include, for example, a display, a hologram device, or a projector and control circuitry to control a corresponding one of the display, hologram device, and projector. According to an embodiment, the display module 1260 may include a touch sensor adapted to detect a touch, or a pressure sensor adapted to measure the intensity of force incurred by the touch.

The audio module 1270 may convert a sound into an electrical signal and vice versa. According to an embodiment, the audio module 1270 may obtain the sound via the input module 1250, or output the sound via the sound output module 1255 or a headphone of an external electronic device (e.g., an electronic device 1202) directly (e.g., wiredly) or wirelessly coupled with the electronic device 1201.

The sensor module 1276 may detect an operational state (e.g., power or temperature) of the electronic device 1201 or an environmental state (e.g., a state of a user) external to the electronic device 1201, and then generate an electrical signal or data value corresponding to the detected state. According to an embodiment, the sensor module 1276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1277 may support one or more specified protocols to be used for the electronic device 1201 to be coupled with the external electronic device (e.g., the electronic device 1202) directly (e.g., wiredly) or wirelessly. According to an embodiment, the interface 1277 may include, for example, a high definition multimedia interface (HDMI), a universal serial bus (USB) interface, a secure digital (SD) card interface, or an audio interface.

A connecting terminal 1278 may include a connector via which the electronic device 1201 may be physically connected with the external electronic device (e.g., the electronic device 1202). According to an embodiment, the connecting terminal 1278 may include, for example, a HDMI connector, a USB connector, a SD card connector, or an audio connector (e.g., a headphone connector).

The haptic module 1279 may convert an electrical signal into a mechanical stimulus (e.g., a vibration or a movement) or electrical stimulus which may be recognized by a user via his tactile sensation or kinesthetic sensation. According to an embodiment, the haptic module 1279 may include, for example, a motor, a piezoelectric element, or an electric stimulator.

The camera module 1280 may capture a still image or moving images. According to an embodiment, the camera module 1280 may include one or more lenses, image sensors, image signal processors, or flashes.

The power management module 1288 may manage power supplied to the electronic device 1201. According to an embodiment, the power management module 1288 may be implemented as at least part of, for example, a power management integrated circuit (PMIC).

The battery 1289 may supply power to at least one component of the electronic device 1201. According to an embodiment, the battery 1289 may include, for example, a primary cell which is not rechargeable, a secondary cell which is rechargeable, or a fuel cell.

The communication module 1290 may support establishing a direct (e.g., wired) communication channel or a wireless communication channel between the electronic device 1201 and the external electronic device (e.g., the electronic device 1202, the electronic device 1204, or the server 1208) and performing communication via the established communication channel. The communication module 1290 may include one or more communication processors that are operable independently from the processor 1220 (e.g., the application processor (AP)) and supports a direct (e.g., wired) communication or a wireless communication. According to an embodiment, the communication module 1290 may include a wireless communication module 1292 (e.g., a cellular communication module, a short-range wireless communication module, or a global navigation satellite system (GNSS) communication module) or a wired communication module 1294 (e.g., a local area network (LAN) communication module or a power line communication (PLC) module). A corresponding one of these communication modules may communicate with the external electronic device via the first network 1298 (e.g., a short-range communication network, such as Bluetooth™, wireless-fidelity (Wi-Fi) direct, or infrared data association (IrDA)) or the second network 1299 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1292 may identify and authenticate the electronic device 1201 in a communication network, such as the first network 1298 or the second network 1299, using subscriber information (e.g., international mobile subscriber identity (IMSI)) stored in the subscriber identification module 1296.

The wireless communication module 1292 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1292 may support a high-frequency band (e.g., the mm Wave band) to achieve, e.g., a high data transmission rate. The wireless communication module 1292 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1292 may support various requirements specified in the electronic device 1201, an external electronic device (e.g., the electronic device 1204), or a network system (e.g., the second network 1299). According to an embodiment, the wireless communication module 1292 may support a peak data rate (e.g., 20 Gbps or more) for implementing eMBB, loss coverage (e.g., 1264 dB or less) for implementing mMTC, or U-plane latency (e.g., 0.5 ms or less for each of downlink (DL) and uplink (UL), or a round trip of 12 ms or less) for implementing URLLC.

The antenna module 1297 may transmit or receive a signal or power to or from the outside (e.g., the external electronic device) of the electronic device 1201. According to an embodiment, the antenna module 1297 may include an antenna including a radiating element composed of a conductive material or a conductive pattern formed in or on a substrate (e.g., a printed circuit board (PCB)). According to an embodiment, the antenna module 1297 may include a plurality of antennas (e.g., array antennas). In such a case, at least one antenna appropriate for a communication scheme used in the communication network, such as the first network 1298 or the second network 1299, may be selected, for example, by the communication module 1290 (e.g., the wireless communication module 1292) from the plurality of antennas. The signal or the power may then be transmitted or received between the communication module 1290 and the external electronic device via the selected at least one antenna. According to an embodiment, another component (e.g., a radio frequency integrated circuit (RFIC)) other than the radiating element may be additionally formed as part of the antenna module 1297.

According to various embodiments, the antenna module 1297 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1201 and the external electronic device 1204 via the server 1208 coupled with the second network 1299. Each of the electronic devices 1202 or 1204 may be a device of a same type as, or a different type, from the electronic device 1201. According to an embodiment, all or some of operations to be executed at the electronic device 1201 may be executed at one or more of the external electronic devices 1202, 1204, or 1208. For example, if the electronic device 1201 should perform a function or a service automatically, or in response to a request from a user or another device, the electronic device 1201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1201. The electronic device 1201 may provide the outcome, with or without further processing of the outcome, as at least part of a reply to the request. To that end, a cloud computing, distributed computing, mobile edge computing (MEC), or client-server computing technology may be used, for example. The electronic device 1201 may provide ultra low-latency services using, e.g., distributed computing or mobile edge computing. In an embodiment, the external electronic device 1204 may include an internet-of-things (IoT) device. The server 1208 may be an intelligent server using machine learning and/or a neural network. According to an embodiment, the external electronic device 1204 or the server 1208 may be included in the second network 1299. The electronic device 1201 may be applied to intelligent services (e.g., smart home, smart city, smart car, or health-care) based on 5G communication technology or IoT-related technology.

According to an example embodiment, an electronic device may comprise: a first antenna, a second antenna, and a third antenna, a first power supply circuit, a second power supply circuit, a first front end module (FEM) including a power amplifier (PA) connected to the first antenna and configured to operate based on a voltage from the first power supply circuit, a second FEM including a PA connected to the second antenna and configured to operate based on a voltage from the second power supply circuit, a third FEM including a PA connected to the third antenna and configured to operate based on the voltage from the first power supply circuit and the voltage from the second power supply circuit and obtain a transmit (Tx) power in a range higher than a range of Tx power obtained using each of the PA in the first FEM and the PA in the second FEM, and at least one processor comprising processing circuitry. According to an example embodiment, at least one processor may be configured to transmit, via the third antenna, a signal with a Tx power obtained using the PA in the third FEM operating based on the voltage from the first power supply circuit and the voltage from the second power supply circuit. According to an example embodiment, at least one processor may be configured to, while the signal is transmitted via the third antenna, disconnect the PA in the first FEM from the first power supply circuit and disconnect the PA in the second FEM from the second power supply circuit.

According to an example embodiment, at least one processor is configured to disconnect the PA in the first FEM from the first power supply circuit to block the voltage from the first power supply circuit provided to the PA in the third FEM for the transmission of the signal provided to the PA in the first FEM. At least one processor is configured to disconnect the PA in the second FEM from the second power supply circuit to block the voltage from the second power supply circuit provided to the PA in the third FEM for the transmission of the signal provided to the PA in the second FEM.

According to an example embodiment, the third FEM may include a switch including a first electrode connected to the PA in the first FEM, a second electrode connected to the PA in the second FEM, a third electrode connected to the PA in the third FEM, a fourth electrode connected to the first power supply circuit, and a fifth electrode connected to the second power supply circuit. According to an example embodiment, at least one processor may be configured to, by controlling, while the signal is transmitted via the third antenna, the switch to connect the fourth electrode to the third electrode from among the first electrode and the third electrode and connect the fifth electrode to the third electrode from among the second electrode and the third electrode, disconnect the PA in the first FEM from the first power supply circuit, disconnect the PA in the second FEM from the second power supply circuit, and provide the voltage from the first power supply circuit and the voltage from the second power supply circuit to the PA in the third FEM for the transmission of the signal.

According to an example embodiment, at least one processor may be configured to control, while a signal is transmitted via the first antenna, the switch to connect the fourth electrode to the first electrode from among the first electrode and the third electrode. According to an example embodiment, at least one processor may be configured to control, while a signal is transmitted via the second antenna, the switch to connect the fifth electrode to the second electrode from among the second electrode and third electrode.

According to an example embodiment, the third FEM may include a first pin connected to the first electrode, a second pin connected to the second electrode, a third pin connected to the fourth electrode, and a fourth pin connected to the fifth electrode. According to an example embodiment, the PA in the first FEM may be connected to the first electrode via the first pin. According to an example embodiment, the PA in the second FEM may be connected to the second electrode via the second pin. According to an example embodiment, the first power supply circuit may be connected to the fourth electrode via the third pin. According to an example embodiment, the second power supply circuit may be connected to the fifth electrode via the fourth pin.

According to an example embodiment, the electronic device may further comprise: a switch positioned outside of the first FEM, the second FEM, and the third FEM and including a first electrode connected to the PA in the first FEM, a second electrode connected to the PA in the second FEM, a third electrode connected to the PA in the third FEM, a fourth electrode connected to the first power supply circuit, and a fifth electrode connected to the second power supply circuit. According to an example embodiment, at least one processor may be configured to, by controlling, while the signal is transmitted via the third antenna, the switch to connect the fourth electrode to the third electrode from among the first electrode and the third electrode and connect the fifth electrode to the third electrode from among the second electrode and the third electrode, disconnect the PA in the first FEM from the first power supply circuit, disconnect the PA in the second FEM from the second power supply circuit, and provide the voltage from the first power supply circuit and the voltage from the second power supply circuit to the PA in the third FEM for the transmission of the signal.

According to an example embodiment, the first FEM may include a switch for connecting the PA in the first FEM to the first power supply circuit and disconnecting the PA in the first FEM from the first power supply circuit. According to an example embodiment, the second FEM may include a switch for connecting the PA in the second FEM to the second power supply circuit and disconnecting the PA in the second FEM from the second power supply circuit. According to an example embodiment, the third FEM may include a switch for connecting the PA in the third FEM to the second power supply circuit and disconnecting the PA in the third FEM from the second power supply circuit. According to an example embodiment, at least one processor may be configured to, while the signal is transmitted via the third antenna, control the switch in the first FEM to disconnect the PA in the first FEM from the first power supply circuit. According to an example embodiment, at least one processor may be configured to, while the signal is transmitted via the third antenna, control the switch in the second FEM to disconnect the PA in the second FEM from the second power supply circuit. According to an example embodiment, at least one processor may be configured to provide, by controlling the switch in the third FEM to connect the PA in the third FEM to the second power supply circuit to transmit the signal via the third antenna, the voltage from the first power supply circuit and the voltage from the second power supply circuit to the PA in the third FEM.

According to an example embodiment, the switch in the third FEM may include a first electrode respectively connected to the first power supply circuit and the PA in the third FEM and a second electrode connected to the second power supply circuit. According to an example embodiment, at least one processor may be configured to provide, by controlling the switch to connect the first electrode to the second electrode, the voltage from the first power supply circuit and the voltage from the second power supply circuit to the PA in the third FEM to transmit the signal via the third antenna.

According to an example embodiment, the third FEM may include a first pin connected to the first electrode and a second pin connected to the second electrode. According to an example embodiment, the first power supply circuit may be connected to the first electrode via the first pin. According to an example embodiment, the second power supply circuit may be connected to the second electrode via the second pin.

According to an example embodiment, at least one processor may be configured to control, while a signal is transmitted via the first antenna, the switch to disconnect the first electrode from the second electrode. According to an example embodiment, at least one processor may be configured to control, while a signal is transmitted via the second antenna, the switch to disconnect the first electrode from the second electrode.

According to an example embodiment, the electronic device may comprise: a first switch positioned outside of the first FEM, the second FEM, and the third FEM, for connecting the PA in the first FEM to the first power supply circuit and disconnecting the PA in the first FEM from the first power supply circuit. According to an example embodiment, the electronic device may comprise a second switch, positioned outside of the first FEM, the second FEM, and the third FEM, for connecting the PA in the second FEM to the second power supply circuit and disconnecting the PA in the second FEM from the second power supply circuit. According to an example embodiment, the third FEM may include a switch for connecting the PA in the third FEM to the second power supply circuit and disconnecting the PA in the third FEM from the second power supply circuit. According to an example embodiment, at least one processor may be configured to control, while the signal is transmitted via the third antenna, the first switch to disconnect the PA in the first FEM from the first power supply circuit. According to an example embodiment, at least one processor may be configured to control, while the signal is transmitted via the third antenna, the second switch to disconnect the PA in the second FEM from the second power supply circuit. According to an example embodiment, at least one processor may be configured to provide, by controlling the switch in the third FEM to connect the PA in the third FEM to the second power supply circuit to transmit the signal via the third antenna, the voltage from the first power supply circuit and the voltage from the second power supply circuit to the PA in the third FEM.

According to an example embodiment, the electronic device may further comprise: a fourth antenna and a fourth FEM including a PA connected to the fourth antenna and configured to operate based on the voltage from the second power supply circuit. According to an example embodiment, the second switch may include a first electrode connected to the second power supply circuit and a second electrode connected a node respectively connected to the PA in the second FEM and the PA in the fourth FEM. According to an example embodiment, at least one processor may be configured to, by controlling, while the signal is transmitted via the third antenna, the second switch to disconnect the second electrode from the first electrode, disconnect the PA in the second FEM from the second power supply circuit and disconnect the PA in the fourth FEM from the second power supply circuit.

According to an example embodiment, at least one processor may be configured to obtain the signal to be transmitted via the third antenna, based on a radio resource control (RRC) idle state of the electronic device being maintained for a reference time.

According to an example embodiment, the electronic device may comprise a display. According to an example embodiment, at least one processor may be configured to display, in response to the RRC idle state being maintained for the reference time, a message indicating whether transmitting the signal via the third antenna, on the display. According to an example embodiment, at least one processor may be configured to obtain the signal to be transmitted via the third antenna in response to receiving a user input indicating to transmit the signal through the message.

According to an example embodiment, the electronic device may comprise an acceleration sensor. According to an example embodiment, at least one processor may be configured to obtain the signal to be transmitted via the third antenna in response to the RRC idle state being maintained for the reference time after data indicating an acceleration higher than a reference acceleration being obtained through the acceleration sensor.

According to an example embodiment, use of the third FEM may be enabled based on a radio resource control (RRC) idle state of the electronic device being maintained for a reference time.

According to an example embodiment, the signal may be transmitted via the third antenna to a satellite.

According to an example embodiment, an electronic device may comprise a first antenna, a second antenna, and a third antenna, a first power supply circuit, a second power supply circuit, a first front end module (FEM) including a power amplifier (PA) connected to the first antenna and configured to operate based on a voltage from the first power supply circuit, a second FEM including a PA connected to the second antenna and configured to operate based on a voltage from the second power supply circuit, a third FEM including a PA connected to the third antenna and configured to operate based on the voltage from the first power supply circuit and the voltage from the second power supply circuit and obtain a transmit (Tx) power in a range higher than a range of Tx power obtained using each of the PA in the first FEM and the PA in the second FEM, and at least one processor. According to an example embodiment, at least one processor may be configured to transmit, via the third antenna, a signal with a Tx power obtained using the PA in the third FEM operating based on a voltage provided from the first power supply circuit and a voltage provided from the second power supply circuit. According to an example embodiment, at least one processor may be configured to: adjust, to a voltage lower than the voltage provided in accordance with the transmission of the signal from the first power supply circuit to the PA in the third FEM, a voltage provided in accordance with the transmission of the signal from the first power supply circuit to the PA in the first FEM and adjust, to a voltage lower than the voltage provided in accordance with the transmission of the signal from the second power supply circuit to the PA in the third FEM, a voltage provided in accordance with the transmission of the signal from the second power supply circuit to the PA in the second FEM.

According to an example embodiment, the first FEM may include a variable resistor including a first electrode connected to the first power supply circuit and a second electrode connected to the PA in the first FEM. According to an example embodiment, the second FEM may include a variable resistor including a first electrode connected to the second power supply circuit and a second electrode connected to the PA in the second FEM. According to an example embodiment, at least one processor may be configured to adjust, by adjusting a resistance of the variable resistor in the first FEM, the voltage provided in accordance with the transmission of the signal from the first power supply circuit to the PA in the first FEM to a voltage lower than the voltage provided in accordance with the transmission of the signal from the first power supply circuit to the PA in the third FEM. According to an example embodiment, at least one processor may be configured to adjust, by adjusting a resistance of the variable resistor in the second FEM, the voltage provided in accordance with the transmission of the signal from the second power supply circuit to the PA in the second FEM to a voltage lower than the voltage provided in accordance with the transmission of the signal from the second power supply circuit to the PA in the third FEM.

According to an example embodiment, the third FEM may include a switch for connecting the PA in the third FEM to the second power supply circuit and disconnecting the PA in the third FEM from the second power supply circuit. According to an example embodiment, at least one processor may be configured to provide, by controlling the switch in the third FEM to connect the PA in the third FEM to the second power supply circuit to transmit the signal via the third antenna, the voltage from the first power supply circuit and the voltage from the second power supply circuit to the PA in the third FEM.

According to an example embodiment, the electronic device may include a first variable resistor including a first electrode connected to the first power supply circuit and a second electrode connected to the PA in the first FEM and positioned outside of the first FEM, the second FEM, and the third FEM. According to an example embodiment, the electronic device may include: a second variable resistor including a first electrode connected to the second power supply circuit and a second electrode connected to the PA in the second FEM and positioned outside of the first FEM, the second FEM, and the third FEM. According to an example embodiment, at least one processor may be configured to adjust, by adjusting a resistance of the variable resistor in the first FEM, the voltage provided in accordance with the transmission of the signal from the first power supply circuit to the PA in the first FEM to a voltage lower than the voltage provided in accordance with the transmission of the signal from the first power supply circuit to the PA in the third FEM. According to an example embodiment, at least one processor may be configured to adjust, by adjusting a resistance of the variable resistor in the second FEM, the voltage provided in accordance with the transmission of the signal from the second power supply circuit to the PA in the second FEM to a voltage lower than the voltage provided in accordance with the transmission of the signal from the second power supply circuit to the PA in the third FEM.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1240) including one or more instructions that are stored in a storage medium (e.g., internal memory 1236 or external memory 1238) that is readable by a machine (e.g., the electronic device 1201). For example, a processor (e.g., the processor 1220) of the machine (e.g., the electronic device 1201) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
   a first antenna, a second antenna, and a third antenna;
   a first power supply circuit;
   a second power supply circuit;
   a first front end module (FEM) including a power amplifier (PA) connected to the first antenna and configured to operate based on a voltage from the first power supply circuit;
   a second FEM including a PA connected to the second antenna and configured to operate based on a voltage from the second power supply circuit;
   a third FEM including a PA connected to the third antenna and configured to operate based on the voltage from the first power supply circuit and the voltage from the second power supply circuit and obtain a transmit (Tx) power in a range higher than a range of Tx power obtained using each of the PA in the first FEM and the PA in the second FEM;
   at least one processor comprising processing circuitry;
   memory, storing instructions, comprising one or more storage mediums; and
   at least one switch,
   wherein the instructions, when executed by the at least one processor individually or collectively, cause the electronic device to:
      transmit, via the third antenna, a signal with a Tx power obtained using the PA in the third FEM operating based on the voltage from the first power supply circuit and the voltage from the second power supply circuit; and
      while the signal is transmitted via the third antenna, through the at least one switch, electrically disconnect the PA in the first FEM from the first power supply circuit and electrically disconnect the PA in the second FEM from the second power supply circuit.

2. The electronic device of claim 1, wherein the instructions, when executed by the at least one processor, cause the electronic device to:

electrically disconnect, through the at least one switch, the PA in the first FEM from the first power supply circuit to block the voltage from the first power supply circuit provided to the PA in the third FEM for the transmission of the signal provided to the PA in the first FEM; and electrically disconnect, through the at least one switch, the PA in the second FEM from the second power supply circuit to block the voltage from the second power supply circuit provided to the PA in the third FEM for the transmission of the signal provided to the PA in the second FEM.

3. The electronic device of claim 1, wherein the at least one switch includes a switch in the third FEM including: a first electrode connected to the PA in the first FEM, a second electrode connected to the PA in the second FEM, a third electrode connected to the PA in the third FEM, a fourth electrode connected to the first power supply circuit, and a fifth electrode connected to the second power supply circuit, and wherein the instructions, when executed by the at least one processor, cause the electronic device to:

by controlling, while the signal is transmitted via the third antenna, the switch to connect the fourth electrode to the third electrode from among the first electrode and the third electrode and connect the fifth electrode to the third electrode from among the second electrode and the third electrode:

electrically disconnect the PA in the first FEM from the first power supply circuit;

electrically disconnect the PA in the second FEM from the second power supply circuit; and provide the voltage from the first power supply circuit and the voltage from the second power supply circuit to the PA in the third FEM for the transmission of the signal.

4. The electronic device of claim 3, wherein the instructions, when executed by the at least one processor, cause the electronic device to:

control, while a signal is transmitted via the first antenna, the switch to connect the fourth electrode to the first electrode from among the first electrode and the third electrode; and control, while a signal is transmitted via the second antenna, the switch to connect the fifth electrode to the second electrode from among the second electrode and third electrode.

5. The electronic device of claim 3, wherein the third FEM further includes: a first pin connected to the first electrode, a second pin connected to the second electrode, a third pin connected to the fourth electrode, and a fourth pin connected to the fifth electrode, wherein the PA in the first FEM is connected to the first electrode via the first pin, wherein the PA in the second FEM is connected to the second electrode via the second pin, wherein the first power supply circuit is connected to the fourth electrode via the third pin, and wherein the second power supply circuit is connected to the fifth electrode via the fourth pin.

6. The electronic device of claim 1, wherein the at least one switch includes:

a switch positioned outside of the first FEM, the second FEM, and the third FEM and including: a first electrode connected to the PA in the first FEM, a second electrode connected to the PA in the second FEM, a third electrode connected to the PA in the third FEM, a fourth electrode connected to the first power supply circuit, and a fifth electrode connected to the second power supply circuit, wherein the instructions, when executed by the at least one processor, cause the electronic device to:

by controlling, while the signal is transmitted via the third antenna, the switch to connect the fourth electrode to the third electrode from among the first electrode and the third electrode and connect the fifth electrode to the third electrode from among the second electrode and the third electrode:

electrically disconnect the PA in the first FEM from the first power supply circuit;

electrically disconnect the PA in the second FEM from the second power supply circuit; and provide the voltage from the first power supply circuit and the voltage from the second power supply circuit to the PA in the third FEM for the transmission of the signal.

7. The electronic device of claim 1, wherein the at least one switch includes:

a switch in the first FEM for connecting the PA in the first FEM to the first power supply circuit and disconnecting the PA in the first FEM from the first power supply circuit, a switch in the second FEM for connecting the PA in the second FEM to the second power supply circuit and disconnecting the PA in the second FEM from the second power supply circuit, and a switch in the third FEM for connecting the PA in the third FEM to the second power supply circuit and disconnecting the PA in the third FEM from the second power supply circuit, and wherein the instructions, when executed by the at least one processor, cause the electronic device to:

while the signal is transmitted via the third antenna, control the switch in the first FEM to electrically disconnect the PA in the first FEM from the first power supply circuit;

while the signal is transmitted via the third antenna, control the switch in the second FEM to electrically disconnect the PA in the second FEM from the second power supply circuit; and provide, by controlling the switch in the third FEM to connect the PA in the third FEM to the second power supply circuit to transmit the signal via the third antenna, the voltage from the first power supply circuit and the voltage from the second power supply circuit to the PA in the third FEM.

8. The electronic device of claim 7, wherein the switch in the third FEM includes:

a first electrode respectively connected to the first power supply circuit and the PA in the third FEM; and a second electrode connected to the second power supply circuit, and wherein the instructions, when executed by the at least one processor, cause the electronic device to:

provide, by controlling the switch in the third FEM to connect the first electrode to the second electrode, the voltage from the first power supply circuit and the voltage from the second power supply circuit to the PA in the third FEM to transmit the signal via the third antenna.

9. The electronic device of claim 8, wherein the third FEM further includes:

a first pin connected to the first electrode; and a second pin connected to the second electrode, wherein the first power supply circuit is connected to the first electrode via the first pin, and wherein the second power supply circuit is connected to the second electrode via the second pin.

10. The electronic device of claim 8, wherein the instructions, when executed by the at least one processor, cause the electronic device to:

control, while a signal is transmitted via the first antenna, the switch in the third FEM to electrically disconnect the first electrode from the second electrode; and control, while a signal is transmitted via the second antenna, the switch in the third FEM to electrically disconnect the first electrode from the second electrode.

11. The electronic device of claim 1, wherein the at least one switch includes:

a first switch, positioned outside of the first FEM, the second FEM, and the third FEM, for connecting the PA in the first FEM to the first power supply circuit and disconnecting the PA in the first FEM from the first power supply circuit;

a second switch, positioned outside of the first FEM, the second FEM, and the third FEM, for connecting the PA in the second FEM to the second power supply circuit and disconnecting the PA in the second FEM from the second power supply circuit; and a switch in the third FEM for connecting the PA in the third FEM to the second power supply circuit and disconnecting the PA in the third FEM from the second power supply circuit, and wherein the instructions, when executed by the at least one processor, cause the electronic device to:

control, while the signal is transmitted via the third antenna, the first switch to electrically disconnect the PA in the first FEM from the first power supply circuit;

control, while the signal is transmitted via the third antenna, the second switch to electrically disconnect the PA in the second FEM from the second power supply circuit; and provide, by controlling the switch in the third FEM to connect the PA in the third FEM to the second power supply circuit to transmit the signal via the third antenna, the voltage from the first power supply circuit and the voltage from the second power supply circuit to the PA in the third FEM.

12. The electronic device of claim 11, further comprising:

a fourth antenna; and a fourth FEM including a PA connected to the fourth antenna and configured to operate based on the voltage from the second power supply circuit, wherein the second switch includes:

a first electrode connected to the second power supply circuit; and a second electrode connected a node that is respectively connected to the PA in the second FEM and the PA in the fourth FEM, and wherein the instructions, when executed by the at least one processor, cause the electronic device to:

by controlling, while the signal is transmitted via the third antenna, the second switch to disconnect the second electrode from the first electrode, disconnect the PA in the second FEM from the second power supply circuit and disconnect the PA in the fourth FEM from the second power supply circuit.

13. The electronic device of claim 1, wherein the instructions, when executed by the at least one processor, cause the electronic device to:

obtain the signal to be transmitted via the third antenna, based on a radio resource control (RRC) idle state of the electronic device maintained for a reference time.

14. The electronic device of claim 13, further comprising:

a display, wherein the instructions, when executed by the at least one processor, cause the electronic device to:

display, in response to the RRC idle state being maintained for the reference time, a message indicating whether transmitting the signal via the third antenna, on the display; and obtain the signal to be transmitted via the third antenna in response to receiving an input indicating to transmit the signal through the message.

15. The electronic device of claim 13, further comprising:

an acceleration sensor, wherein the instructions, when executed by the at least one processor, cause the electronic device to:

obtain the signal to be transmitted via the third antenna in response to the RRC idle state maintained for the reference time after data indicating an acceleration higher than a reference acceleration being obtained through the acceleration sensor.

16. The electronic device of claim 1, wherein use of the third FEM is enabled based on a radio resource control (RRC) idle state of the electronic device being maintained for a reference time.

17. The electronic device of claim 1, wherein the signal is transmitted via the third antenna to a satellite.

* * * * *